United States Patent [19]

Birch et al.

[11] Patent Number: 5,451,885
[45] Date of Patent: Sep. 19, 1995

[54] INTERCONNECT STRESS TEST COUPON

[75] Inventors: Stephen M. Birch, Nepean; Gerard M. Gavrel, Alymer; Zaffar I. Memon, Ottawa, all of Canada

[73] Assignee: Digital Equipment Corporation, Maynard, Mass.

[21] Appl. No.: 373,916

[22] Filed: Jan. 17, 1995

Related U.S. Application Data

[63] Continuation of Ser. No. 88,231, Jul. 6, 1993, abandoned.

[51] Int. Cl.⁶ .................................................. G01R 31/02
[52] U.S. Cl. .................................... 324/760; 324/73.1; 324/158.1; 324/537; 324/538
[58] Field of Search .................. 324/760, 73.1, 158.1, 324/537, 538

[56] References Cited

U.S. PATENT DOCUMENTS

| | | | |
|---|---|---|---|
| 4,510,446 | 4/1985 | Braun | 324/158 R |
| 4,894,606 | 1/1990 | Paur | 324/65 R |
| 4,985,675 | 1/1991 | Turndic | 324/158 R |
| 5,172,063 | 12/1992 | Munikoti et al. | 324/537 |

OTHER PUBLICATIONS

Munikoti, R. and Dhar, P. "A New Power Cycling Technique for Accelerated Reliability Evaluation of Plated Through Holes and Interconnects in PCB's"; IEEE Transactions on Components Hybrids, and Manufacturing Technology Dec. 1990 vol. 13, No. 4, pp. 865-872.

Munikoti, R. and Dhar, P. "New Power Cycling Technique for Accelerated Reliability Evaluation of Plated-Through-Holes and Interconnects in PCBs"; 40th Electronic Components and Technology Conference in Las Vegas May 1990 17 pages.

Strang, M. "Power cycling"; *Quality* Sep. 1980 pp. 29–31.

Murcko, R. and Tomine, J. "Detecting Subtle Flaws with Temperature Cycle Testing"; *Circuits Manufacturing* Dec. 1982 pp. 63–65.

*Primary Examiner*—Kenneth A. Wieder
*Assistant Examiner*—Mark Wardas
*Attorney, Agent, or Firm*—Mary M. Steubing; Ronald C. Hudgens

[57] ABSTRACT

This disclosure describes an Interconnect Stress Testing (IST) system and a printed wiring board test coupon which is used with the IST system. The system includes a computer device and a cabinet which is used for mounting the test coupon as well as housing a number of the other components that make up the system. During a pre-cycling phase, the system determines the correct current that should be passed through the coupon in order to heat it to a predetermined temperature. After that test current value is determined the system actually stress tests the coupon by passing the determined test current through the coupon. It does so for a selected number of cycles, and monitors resistance changes in the coupon during testing while recording test data. This disclosure also describes the test coupon, which is designed to uniformly dissipate the heat created during stress cycling.

18 Claims, 12 Drawing Sheets

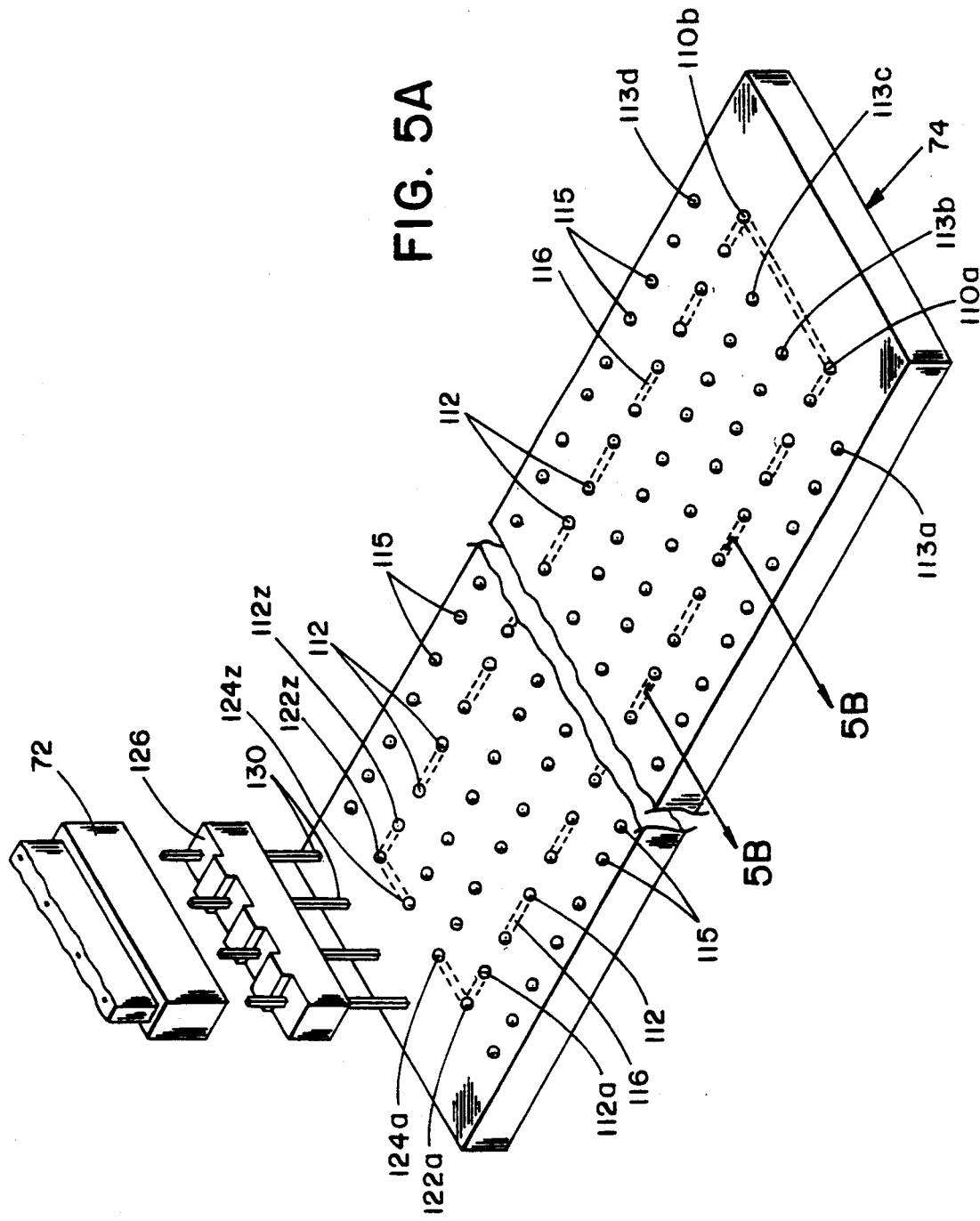

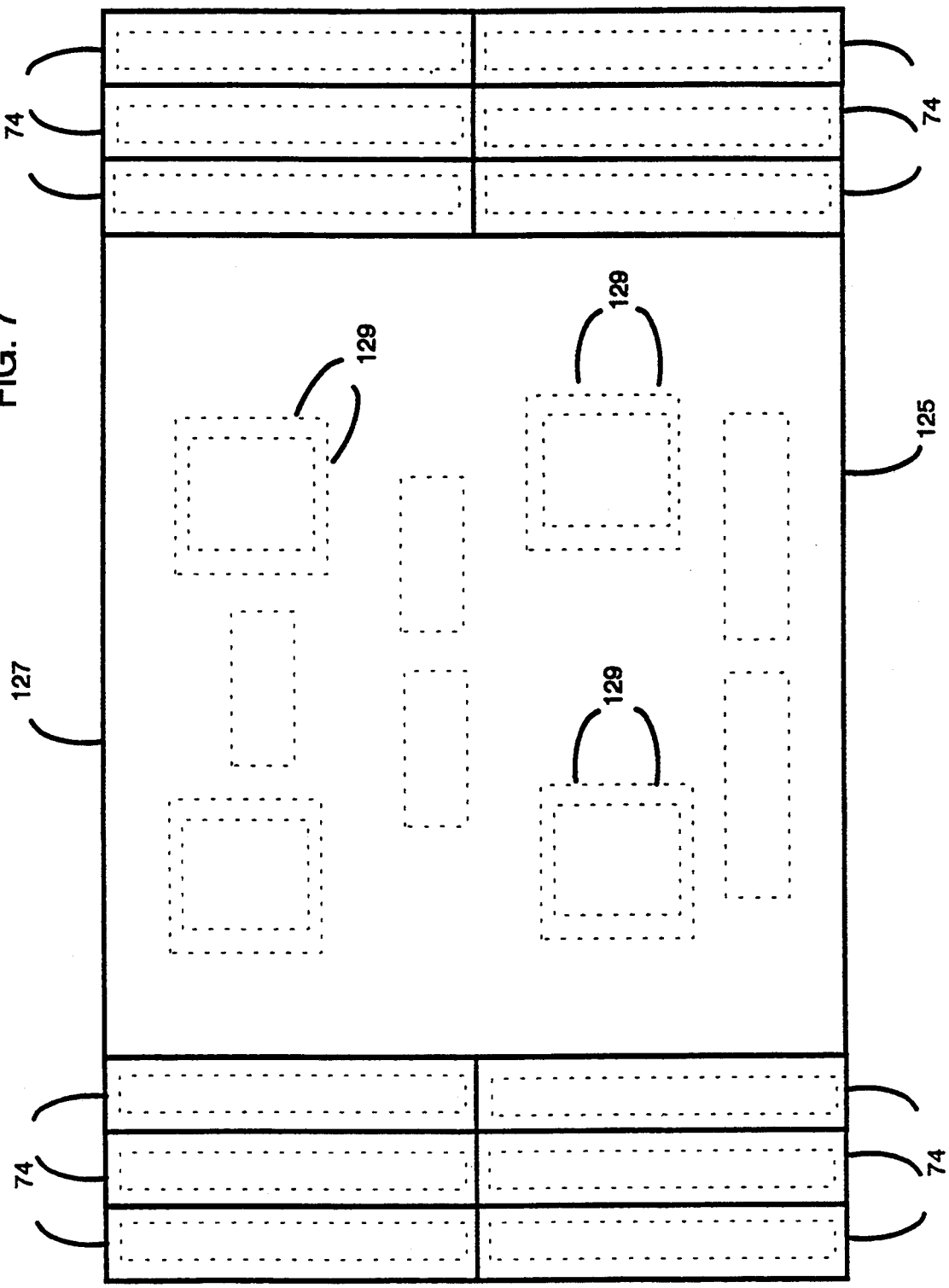

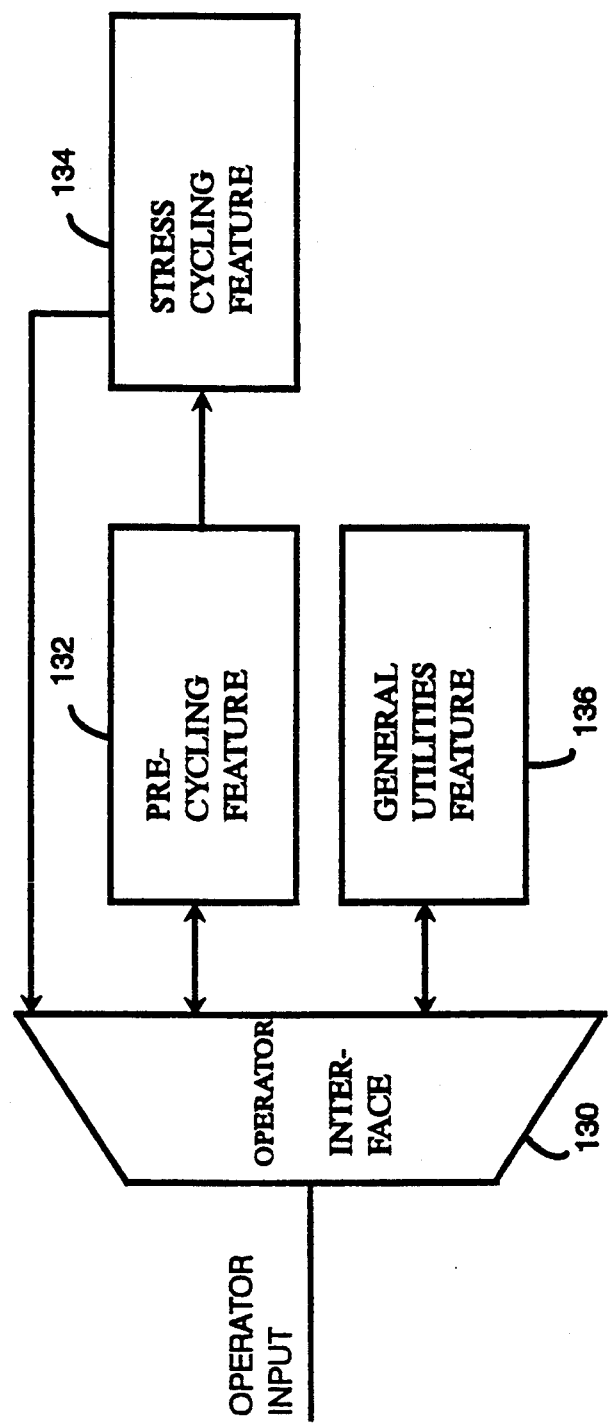

FIG. 10

| If HITEMP = 160°C and RESROOM (miliohms) is: >/= but < | | then CURTEST$_{intl}$, Amps is: | If HITEMP = 160°C and RESROOM (miliohms) is: >/= but < | | then CURTEST$_{intl}$, Amps is: |
|---|---|---|---|---|---|
| 800 | - 450 | 5.13 | 290 | - 280 | 5.80 |
| 450 | - 440 | 5.17 | 280 | - 276 | 5.83 |
| 440 | - 430 | 5.21 | 276 | - 272 | 5.87 |
| 430 | - 420 | 5.25 | 272 | - 268 | 5.91 |
| 420 | - 410 | 5.29 | 268 | - 264 | 5.95 |
| 410 | - 400 | 5.33 | 264 | - 260 | 5.98 |
| 400 | - 390 | 5.37 | 260 | - 250 | 6.03 |
| 390 | - 380 | 5.41 | 250 | - 240 | 6.10 |
| 380 | - 370 | 5.45 | 240 | - 230 | 6.18 |
| 370 | - 360 | 5.49 | 230 | - 220 | 6.27 |
| 360 | - 350 | 5.53 | 220 | - 210 | 6.37 |
| 350 | - 340 | 5.57 | 210 | - 200 | 6.48 |
| 340 | - 330 | 5.61 | 200 | - 180 | 6.60 |
| 330 | - 320 | 5.65 | 180 | - 170 | 6.73 |
| 320 | - 310 | 5.69 | 170 | - 160 | 6.87 |
| 310 | - 300 | 5.73 | 160 | - 150 | 6.92 |
| 300 | - 290 | 5.77 | 150 | - 100 | 7.08 |

INTERCONNECT STRESS TEST COUPON

This application is a continuation of application Ser. No. 08/088,231, filed Jul. 6, 1993 now abandoned.

FIELD OF THE INVENTION

This invention relates to accelerated aging of plated through hole (PTH) interconnects in the test coupon of a printed wiring board ("PWB" or "board") by thermally stressing the interconnects using electric current.

BACKGROUND OF THE INVENTION

PWB's are typically made of rigid or flexible layers of insulation materials with alternate printed wiring and/or printed circuit layers that have been bonded together and electrically interconnected with PTH's. PTH's, which are commonly referred to as "vias" or "barrels", form the electrical interconnections between conductive patterns on internal and/or external layers of the printed wiring board. Prior to placing a given PWB through the component assembly operation, it is desirable to test the board, including it's electrical interconnect integrity, to determine whether it is able to withstand the thermal/mechanical stresses experienced during the actual manufacturing assembly process and the product's end use environment.

There are presently a number of accelerated aging methods by which PWB's are tested, with each test generally designed to simulate the stresses that cause the deterioration resulting from natural aging. Thus, such accelerated aging techniques will artificially reproduce and hasten inherent failure modes within the tested PWB. Such aging will have the effect of mechanically straining the layers of the board and the barrel interconnects, due to thermal expansion and contraction. Accordingly, latent defects in the board will be revealed as the cyclic stressing mechanically exercises any weak or defective element to failure. To the extent that the fatigue cycling is done on an accelerated basis, relative to what is normally experienced in manufacturing assembly and in the field, reliability predictions relating to the board can be derived from the test.

Several test methods involve the testing of a specific test "coupon", which is typically a smaller printed wiring board which has been manufactured concurrently on the PWB panel solely for test purposes. Test coupons are manufactured as an integral part of the actual board, and therefore are subject to the same manufacturing conditions and processes as the board with which a given coupon is associated. Therefore, the quality of a given test coupon is a reliable indication of the quality of its associated board, and for all intents and purposes the test coupon is a PWB.

Accordingly, a majority of test methods do not test the board itself, rather they test the test coupon associated with the board. One such test procedure involves thermally cycling the test coupon in a chamber which alternately heats and cools the coupon. This particular approach has been endorsed as the benchmark standard by the Institute for Interconnecting and Packaging Electronic Circuits ("IPC"). The industry standard method has been published in MIL-STANDARD 202F, METHOD 107G, and this standard will hereinafter be referred to by the name "Mil-T", as it is commonly referred to in the interconnect industry.

Although Mil-T cycling is presently sanctioned as the standard by IPC, there are a number of known drawbacks to Mil-T as a test procedure for PWB's. For example, a complete test of a given coupon may take as long as 40 days for the coupon to be processed through the one hundred to one thousand cycles necessary to simulate expected life usage. Further, the operation of a Mil-T chamber can be expensive insofar as the chilled portion of the chamber typically relies upon liquid nitrogen, which is costly to ship, store, and use, and which presents certain environmental concerns.

The Mil-T approach also has the drawback that actual test data relating to a given coupon can be dependent on where the coupon is physically placed in the chamber, which draws into question the "repeatability" of the test procedure. And, test data relating to a given coupon can also be dependent upon which particular chamber the coupon is tested in, which calls into question the "reproducibility" of the test procedure. Finally, the actual operation of a given Mil-T chamber may be technically complex given that a high degree of technical expertise is required in order to insure that all of the coupons in the chamber are cycled to the desired temperature, during the desired time period, and so on.

In order to address the drawbacks of the Mil-T approach, a number of other PWB testing approaches have been developed. For example, one such alternative method heats and cools the coupon by exposing it to a fluidized sand bath. Another method heats and cools the coupon by alternately immersing it in hot and cold liquids, such as oil. Yet a third alternative is generally referred to as the "Power Cycling Technique" ("PCT"). Through the PCT method, DC current is run through the coupon, which causes the coupon to heat up, so that the board and its interconnects are thermally stressed. With respect to all such known methods, however, they likewise have their own drawbacks, relating to factors such as slowness, expense, repeatability, and reproducibility.

Additional drawbacks of known approaches to running DC current through a test coupon relate to the ability of the coupon to uniformly dissipate the heat that is naturally generated during the test. In particular, known coupon designs tend to have rows and columns of interlinked vias, with some such vias positioned on the periphery of the coupon, while others are on the interior of the coupon. Due to the differing heat dissipation properties of the vias positioned on the interior verses the vias positioned on the periphery, some vias will heat to as much as 40° C. greater than other vias which are on the same coupon. Consequently, the hotter, centrally located vias tend to be the ones which are stressed to a significantly greater degree than the cooler ones, and they will naturally fail sooner. Therefore, using coupon designs in which there is generally un-uniform heating results in test data which is naturally limited to those particular vias that were greatly stressed, as opposed to test data relating to all of the vias on the coupon.

Accordingly, what is needed is a PWB test method which addresses the drawbacks of the Mil-T approach, and other known alternate test methods. More specifically, what is needed is a PWB test approach which can achieve identical failure modes/mechanisms and be run in a relatively short time, at a reasonably low cost, with good repeatability and reproducibility characteristics, and which is easy to implement. The test procedure should correlate with the existing Mil-T standard, such that there is a relationship between the cycles of the new test approach and the cycles of the Mil-T approach. Additionally, what is needed is a test coupon that has a generally uniform heat profile, such that the vias on the coupon are roughly the same temperature during coupon testing. Only then are all of the vias going to have approximately the same stresses placed on them, such that all vias are useful for deriving reliable test data.

SUMMARY OF THE INVENTION

This invention generally relates to a printed wiring board coupon which is used for testing the integrity of a printed wiring board associated with the coupon. The coupon is formed by a number of electrically interconnected test vias disposed within a substrate, such as FR4 glass resin. In some embodiments the test vias are interconnected with trace conductors positioned within the substrate, while in other embodiments the test vias are positioned on external surfaces of the coupon. The coupon is stress tested by passing a DC current through it, thereby causing the temperature of the coupon to elevate and mechanically stress the vias and their surrounding material.

A feature of the coupon is that the test vias are positioned on the substrate in such an arrangement that the area surrounding the test vias generally, uniformly dissipates the heat generated when the stress test current is applied. For example, one such arrangement involves the positioning of the test vias in two parallel rows. Furthermore, with the parallel rows spaced a sufficient distance apart, the vias are thermally isolated from one another such that the test vias in one row do not influence the heating of the test vias in the other row when current is applied. The advantage of such a coupon design is that there is no so-called "hot spot" on the coupon in which the test vias in one section experience significantly elevated temperatures relative to the other test vias. Therefore, all of the test vias on the coupon generally experience the same type of stresses during testing, resulting in more reliable test data.

In another embodiment of the invention, the coupon includes additional vias which effectively surround the test vias, but which are not electrically interconnected with the test vias. These are included to better simulate the conditions that exist on the printed wiring board with which the coupon is associated.

Yet another embodiment of the invention relates to a PWB panel, which contains a PWB board and the associated coupons that are processed along with the board and eventually detached for testing. Still another embodiment of the invention pertains to the method of making the coupon so that it generally, uniformly dissipates the heat generated during stress testing.

Other objects, features, and advantages of the invention will be further appreciated and better understood upon consideration of the following detailed description of the preferred embodiment, presented in conjunction with the accompanying drawings.

BRIEF DESCRIPTION OF THE DRAWINGS

FIGS. 5A and 5B provide a more detailed and sectioned view of the coupon shown in FIG. 3.

FIG. 7 provides a block style diagram of a panel which includes a printed wiring board and twelve associated test coupons.

FIG. 8 shows a block diagram of the major program options available through the IST system of FIG. 1.

FIG. 10 is a table of resistance values for a coupon at room temperature, and corresponding test current values.

DETAILED DESCRIPTION OF THE PREFERRED EMBODIMENT

A. IST System Overview.

The preferred embodiment of the present invention relates to an interconnect stress test (IST) system which is for testing test "coupons". As discussed above, a test "coupon" is integrally manufactured and processed together with a related printed wiring board. Generally, the system of the preferred embodiment tests the coupon by thermally cycling it by first running electric DC current through the daisy chained vias of the coupon and then cooling the coupon with fans. During the expansion and contraction of the coupon which occurs as a result of the cycling, the coupon is monitored by the system in order to accumulate information relating to the changes in the resistance of the coupon through the temperature range. Such information can then be used to indicate the expected useful life of the printed wiring board with regard to its interconnect integrity.

Figure 1:
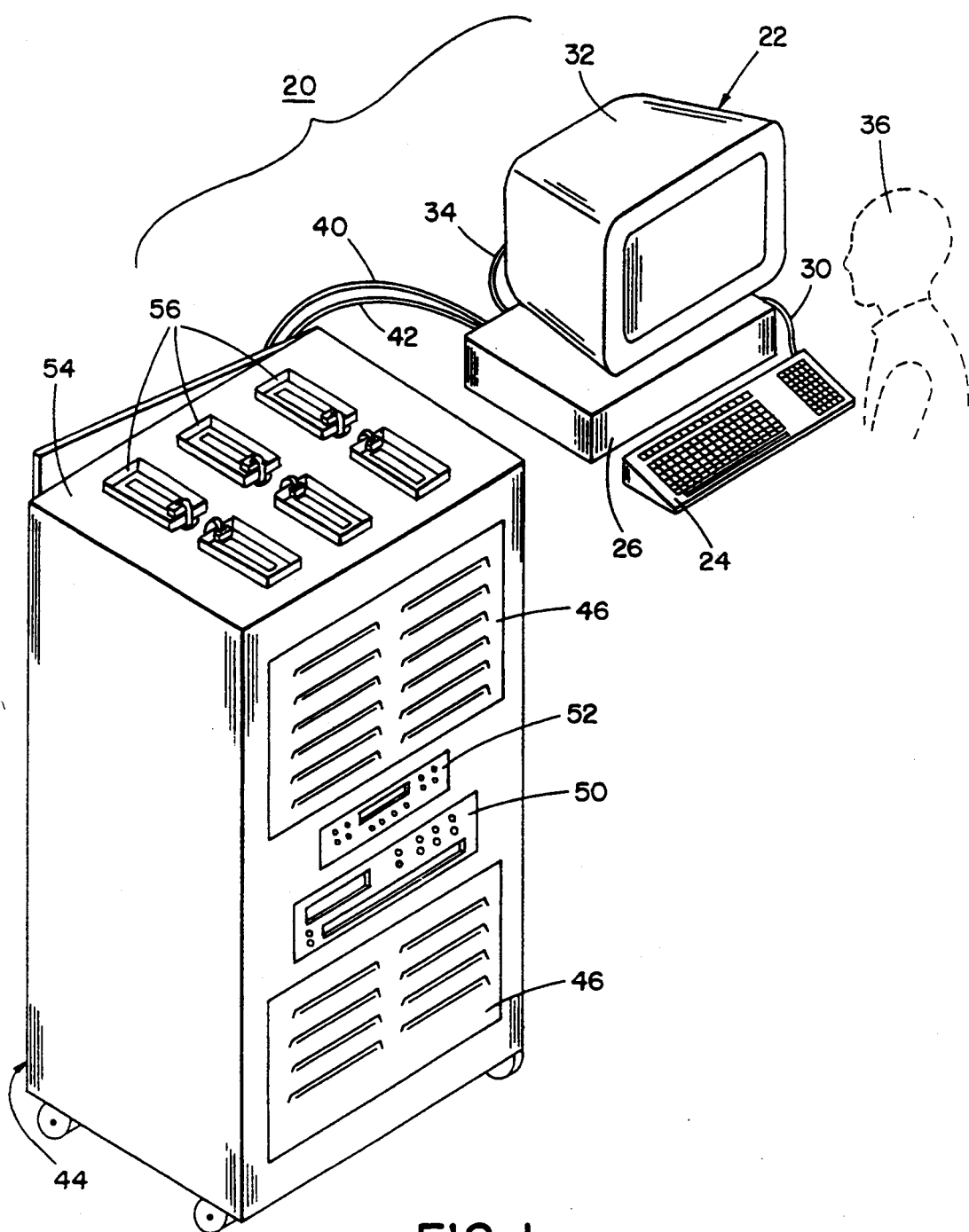
FIG. 1 shows an embodiment of an Interconnect Stress Testing (IST) System, including a cabinet for mounting the coupons to be tested and a personal computer with an operator seated in front of the computer.

Referring now to FIG. 1, an embodiment of the Interconnect Stress Test ("IST") system, in accordance with the present invention, is shown in an oblique view. IST system 20 includes a personal computer system 22, which in this embodiment is a DECstation model 325c, which is commercially available from Digital Equipment Corporation of Maynard, Mass. Computer system 22 includes keyboard 24, coupled to computer 26 by cable 30, and video monitor 32, coupled to computer 26 by cable 34. Seated in front of computer 26, and shown in phantom, is operator 36, who interacts with computer system 22, as discussed below.

Though not separately detailed in any of the drawings, computer 26 generally includes a microprocessor and memory, which gives computer 26 the ability to store, access, and process information, as with any general purpose computer. The memory of computer 26, includes a combination of electronic RAM, a 52 Mbyte hard drive, and a 1.2 Mbyte 5.25" floppy drive, which stores software programs that can be run by computer 26, resulting in computer 26 providing instruction signals to other components of IST system. 20, as detailed below. Also not specifically shown in the drawings, computer 26 includes a math coprocessor, a SVGA graphic adapter, and at least a DOS 3.3 operating system, all features which are commercially available on the DECstation 325c.

Computer 26 further includes a counter, a clock, and a V88 IEEE control board, which interfaces the other processing elements of computer 26 with I/O buses 40, 42. These three particular elements are shown in block diagram form on FIG. 4 as reference numerals 96, 94, and 92, respectively.

Although in this particular embodiment, the DECstation 325c of Digital Equipment Corporation has been used, in other embodiments, another computer system could be used provided it offers equivalent functionality.

In addition to computer system 22, IST system 20 also includes cabinet 44, which contains other components of IST system 20 and which holds the coupons during stress testing. Cabinet 44 is generally a rigid framework which is made of sheet metal which has louvered panels 46. As shown in FIG. 1, mounted so that the visual displays and control panels of each are readily accessible, cabinet 44 includes power supply 50 which can provide six programmed current values to six test coupons simultaneously. Also, cabinet 44 includes microvoltmeter 52 which can measure the voltage drop across test coupon resistances.

In one particular embodiment, power supply 50 is a Farnell model 11921 power supply made by Farnell Instruments Ltd., Wetherby, West Yorkshire, England U.K. Power supply 50 is a programmable power supply such that it can be instructed to output six specific currents simultaneously. Microvoltmeter 52 is a Keithley model 197A Autoranging microvolt DMM made by Keithly Instruments Inc., P.O. Box 94525, Cleveland, Ohio, USA.

As shown in FIG. 1, the top 54 of cabinet 44 includes six identical test heads 56, which are used for securing test coupons (not shown in FIG. 1, but shown as reference numeral 74 in FIG. 3) during the actual stress test.

Figure 2:
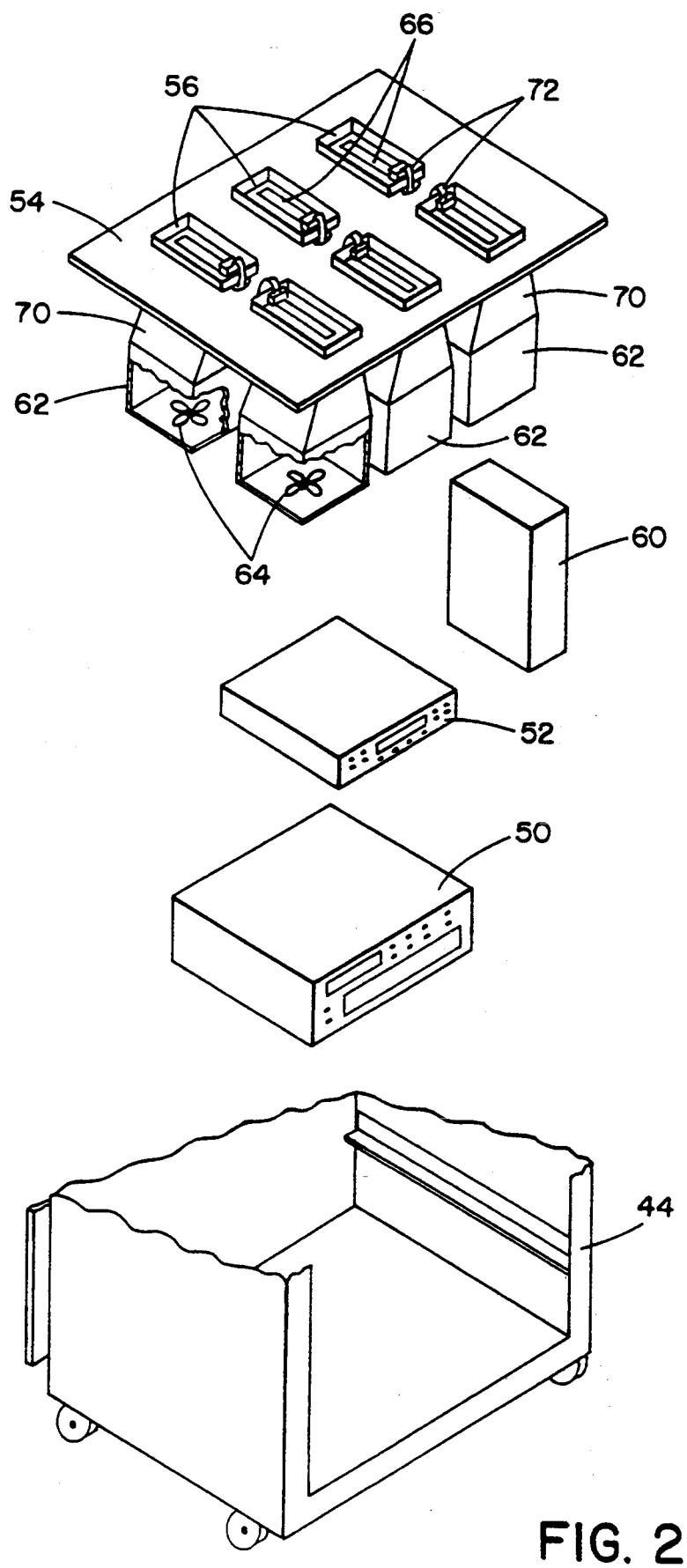
FIG. 2 shows a sectioned and exploded view of the cabinet of FIG. 1.
Figure 4:
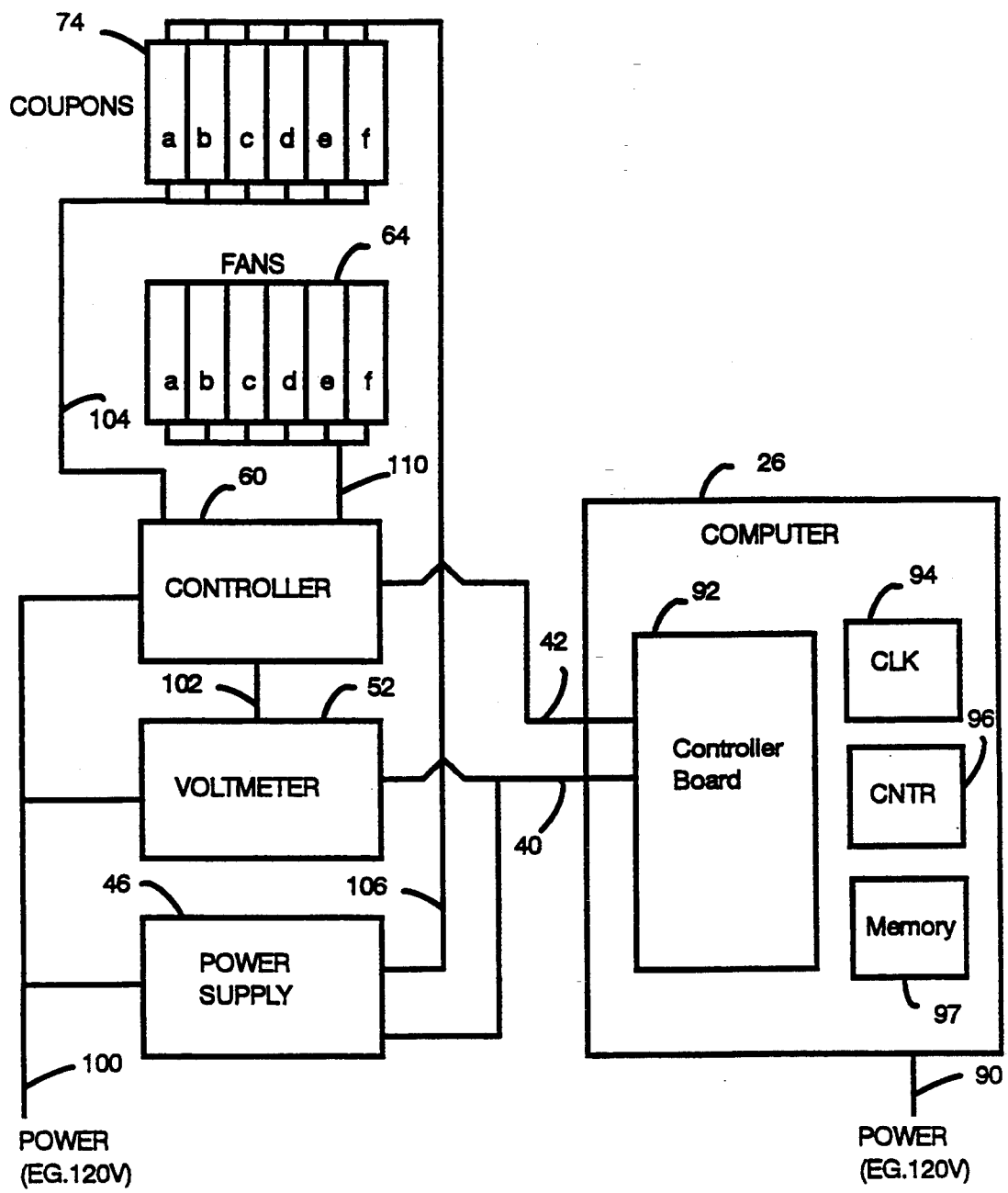
FIG. 4 shows a block diagram of the major components included in the cabinet and computer in FIG. 1.

Referring now to FIG. 2 a more detailed view of the contents of cabinet 44 is provided. In particular, cabinet 44 of FIG. 1 has been laterally sectioned with a large portion removed, and the components within cabinet 44 have been separated from one another for clearer viewing. It should be noted that none of the hardware which is used to secure the components in cabinet 44 and none of the cable interconnections between the components are shown in FIG. 2 for purposes of drawing clarity. In FIG. 4, however, a block diagram of the electrical interconnections of the major components of IST system 20 is provided.

Cabinet 44 includes power supply 50 and microvoltmeter 52. In addition, cabinet 44 includes controller 60 which is used to control the operations of other components in IST system 20, as will be detailed below. Also, in FIG. 2 it can be seen that mounted below the top 54 of cabinet 44 are six fan housings 62. Each fan housing 62 includes its own separate fan 64, two of which are visible from the partial cut away view of FIG. 2.

Each such fan 64 is mounted so that it is positioned below a corresponding head 56. Additionally, as seen in greater detail on FIG. 3, each head 56 has an opening 66 such that forced air can pass through opening 66 from the inside to the outside of cabinet 44, or vice versa. In one embodiment, with a given fan 64 operating, air will be drawn from the bottom of cabinet 44 and pushed up through the corresponding opening 66. As shown in FIG. 2, fan housings 62 each have a tapered portion 70 so that air pulled by fans 64 from the bottom of cabinet 44 is then pushed into the channel formed by tapered portion 70 and then through the underside of each respective opening 66.

In addition to showing the six heads 56 on the top 54 of cabinet 44, FIG. 2 shows each head 56 to have a corresponding coupon cable 72. As will be detailed below, coupon cable 72 includes the electrical connections necessary for providing current and for measuring the voltage drop across each coupon which is being tested.

Figure 3:
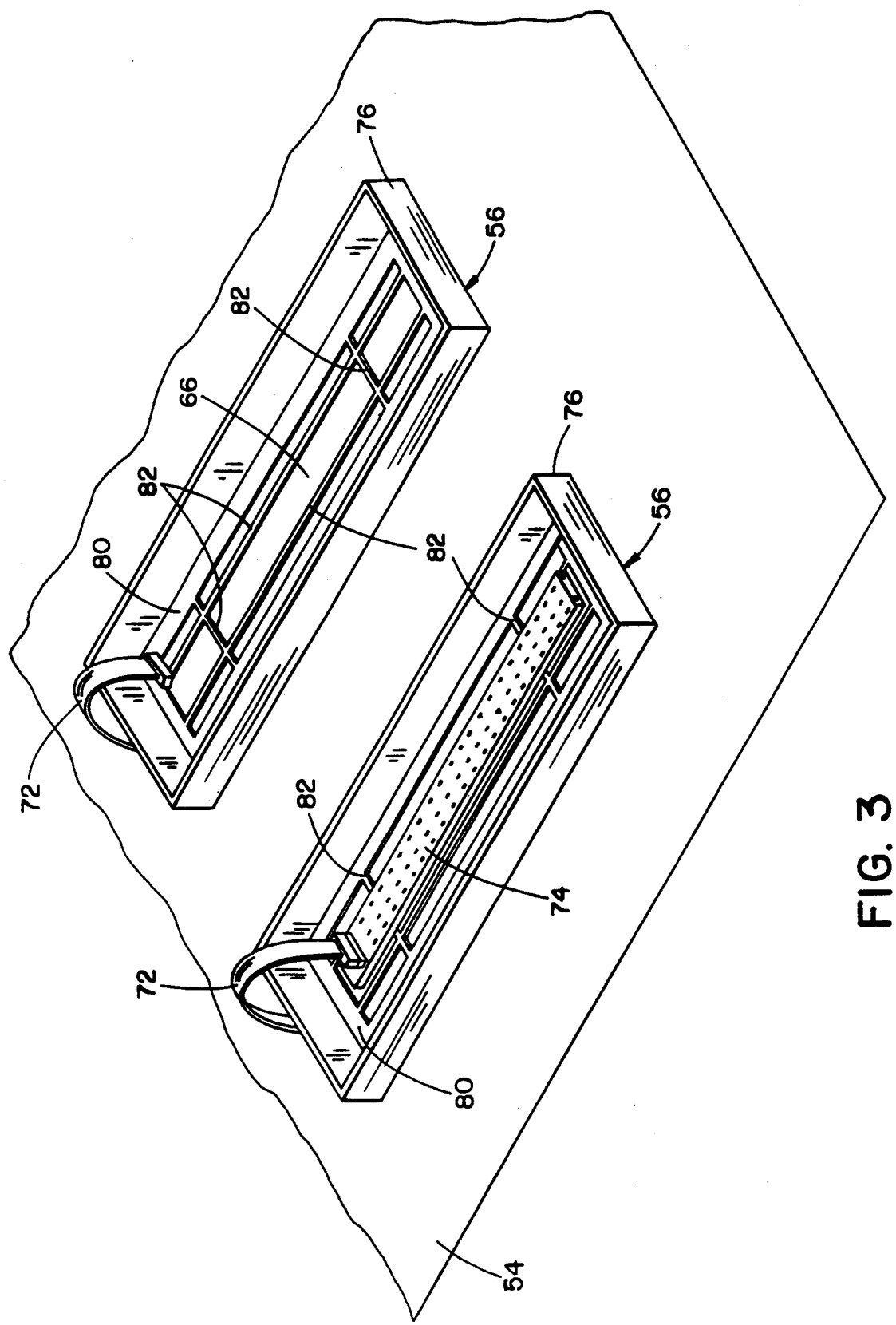
FIG. 3 shows the heads on the top of the cabinet in FIG. 1 and 2, which are used for mounting coupons, with one of the heads having a coupon mounted therein.

Referring now to FIG. 3, a partially sectioned view of the top 54 of cabinet 44 is provided. Included in FIG. 3 are two heads 56 one of which has coupon 74 mounted therein for testing, while the other head 56 does not. Each head 56 includes a rectangularly shaped frame 76, into which coupons of varying size may be mounted. The bottom portion 80 of each head 56 includes a number of thin rails 82, which form a grate like structure, on which coupons 74 are placed during testing. Accordingly, rails 82 form a support structure for coupon 74 through which air may permeate. As discussed above, when fans 64, shown in FIG. 2, are operating, air inside cabinet 44 will be pushed up through rails 82. If, as is shown in one of the heads 56 on FIG. 3, a coupon 74 is positioned on rails 82, the blowing air will cool coupon 74 to approximately the ambient air temperature. In this manner, coupons 74 which are heated during one portion of the testing cycle of IST system 20, can then be cooled. Also, FIG. 3 shows a more detailed view of two coupon cables 72, one of which is attached to coupon 74.

Referring now to FIG. 4, an electrical, block diagram is provided showing the electrical interconnections of the major components of IST system 20. Computer 26 includes power cable 90, which is used to couple computer 26 to a conventional power source, such as a wall outlet supplying 120 V AC. Computer 26 includes control board 92, which in the preferred embodiment is a commercially available IEEE—488 control board, which provides the interface for controlling other components in IST system 20. Computer 26 also includes clock 94 for timing, and counter 96 for counting, in the preferred embodiment, both clock 94 and counter 96 are embedded in the operating system software.

Control board 92 is coupled to one end of bus 42, which is a ribbon cable which includes multiple signal paths. For example, in one implementation, bus 42 is a 40 pin ribbon cable, which means that it can carry 40 separate electrical signals; however, in this particular implementation not all 40 lines are needed. The other end of bus 42 is coupled to controller 60; therefore, bus 42 is the electrical interconnection through which computer 26 provides signals to and thereby controls the operation of controller 60.

Control board 92 is also coupled at one end to cable 40, which is the standard IEEE—488 interface bus. The other end of cable 40 is coupled to power supply 50 and microvoltmeter 52. Cable 40 is the electrical interconnection through which computer 26 provides signals to and controls the operation of power supply 50. Also, cable 40 is the electrical interconnection through which computer 26 receives information from microvoltmeter 52, in particular, signals corresponding to the voltage drop across coupons 74 being tested.

Controller 60, microvoltmeter 52, and power supply 50 are all shown to be connected to cable 100, which is the cable through which each such component can be coupled to an electric power source, such as a typical wall outlet providing 120 V AC.

In FIG. 4, microvoltmeter 52 is shown to be coupled to controller 60 through bus 102. In this particular implementation, controller 60 serves to multiplex the access of voltmeter to the six coupons that can be tested at one single time. In other words, during actual operation controller 60 multiplexes microvoltmeter 52 so that microvoltmeter 52 will at one time take a reading of a voltage drop across coupon 74a, then coupon 74b, then coupon 74c, and so on. In the meanwhile, the voltage reading across a given coupon is transmitted back to computer 26 over cable 40. After reading all six coupons, controller will start again with coupon 74a, and continue in this shared access manner.

Given that microvoltmeter 52 is actually coupled to controller 60, and not the coupons 74, themselves, the physical and electrical interconnection between microvoltmeter 52 and the coupons 74 is established through controller 60. As shown, controller 60 is coupled with each of the six coupons through bus 104, which provides the path through which controller connects microvoltmeter 52 to any single coupon 74 at a given point in time.

Power supply 50 is coupled to coupons 74 over a separate bus 106. As indicated above, power supply 50 is capable of providing DC electric current to six separate coupons 74 simultaneously. Accordingly, through cable 40 computer 26 controls the operation of power supply 50, such that computer 26 effectively causes power supply 50 to turn its six power sources on and off, and computer 26 can also control the amount of current that is provided to each of the six coupons 74 over bus 106.

Finally in FIG. 4, controller 60 also operates as a controller for the six fans 64. As such, controller 60 receives a signal over bus 42, determining a list of fans 64 that should be turned on. When cooling is requested, controller 60 actually transmits the signal to fans 64 over bus 110.

Thus far each of the major components of IST system 20 have been described as being commercially available from various sources. Controller 60, on the other hand, is designed specifically for IST system 20. As explained above, the purpose of controller 60 is to multiplex or switch access to the various components in cabinet 44.

In one embodiment, controller 60 uses the individual signals that are provided on bus 42, to turn various components on or off, or to multiplex access. In this embodiment, one of the signal lines, or bit lines, of bus 42 can be designated to control fan 64a, for example. Using conventional circuitry design, that given bit line can be coupled to a transistor, which can be used to turn on a relays. Thus, when the bit signal is high, for example, the transistor will turn on the relay, which in turn will turn on fan 64a. This same design can be repeated for the other five fans 64, using other bit signal lines on bus 42.

Also, this same design can be used to achieve the multiplexing of the measurement of the voltage drops across the six coupons by microvoltmeter 52. Again, a single bit line of bus 42 can be coupled with a transistor which turns a relay on and off in order that microvoltmeter 52 be effectively coupled with only coupon 74a, for example, so that microvoltmeter 52 reads the voltage drop across coupon 74a at a given point in time. Five other bit lines of bus 42 are used to control five other relays which likewise establish the access of microvoltmeter 52 to the other five coupons 74. Meanwhile the information relating to the measured voltage drops are transmitted back to computer 26 by microvoltmeter 52 over cable 40.

B. IST Coupon.

Referring now to FIG. 5A, coupon 74, illustrated in FIG. 3 and used in connection with IST stress testing, is shown in a more detailed, but sectioned, view. In the rendering of FIG. 5A, coupon 74 has been sectioned through the middle such that a significant amount of the inner portion of the coupon has been eliminated from the illustration in order to provide greater detail of the portions shown. The middle portion of coupon 74 that has been sectioned away, however, would be a continuation and repetition of the coupon 74 portions that are shown in FIG. 5A.

The substrate forming coupon 74 is principally made of multiple layers of a flame retardant glass resin, such as tetra-functional FR4 or multi-functional FR4. Although the number of layers may vary in different PWB coupon constructions, practical designs of coupon 74 include between 2–12 layers. More specifically, coupon 74 includes internal layers of FR4 laminate, having etched copper circuitry on either side, and surface layers of copper foil. In between such layers are additional layers of FR4 bonding material. After such multiple layers are combined, they are compressed, heated and cured. The standard thickness of coupon 74 is measured between 0.060" to 0.160".

The embodiment of coupon 74 shown in FIG. 5A includes two rows 110a, 110b of approximately fifty-six interconnected plated through holes, or vias 112. Additionally, coupon 74 further includes four rows, 113a, 113b, 113c, 113d, of non-connected vias 115, two of which rows run on either side of rows 110a and 110b. Although vias 115 are not interconnected with any of the circuitry of coupon 74, and therefore do not conduct electricity or generate heat during the stress testing process, they are included to more closely simulate the vias that occur on the printed wiring board with which coupon 74 is associated, and therefore enhance test accuracy. Other embodiments of coupon 74 may be constructed with no such unconnected vias 115, having rather only rows 110a, 110b.

Referring now more specifically to vias 112, the preferred embodiment of coupon 74 has two rows of approximately fifty-six vias 112 per row, totaling one hundred and twelve vias 112 on the coupon. These two rows are separated by a distance of at least 0.300" with a preferred separation of 0.400". As discussed above, FIG. 5A shows fewer vias 112 and 115 due to the fact that the middle portion of the coupon is sectioned away and eliminated from the drawing.

After the layers of coupon 74 are formed in the manner discussed above, coupon 74 is further processed by having the holes, which form vias 112 and 115 drilled into the multi-layer substrate. After drilling, the holes are cleaned and catalyzed so that they will accept a conductive plating. Then, the catalyzed holes are plated with an electroless deposited copper, followed by plating with electrolytic deposited copper. Generally, the holes may be further plated with an electrolytic tin/lead finish. Each such hole which forms a via 112 is on a 0.100" pitch relative to an adjoining, interconnected hole, meaning that the center to center measured distance between any two such holes is 0.100". Additionally, each such via 112 should be a minimum of 0.100" from the nearest edge of coupon 74.

Vias 112 are sequentially connected from one to the next using copper trace conductors 116, which each have a width of approximately 0.022". Trace conductors 115 are typically made of rolled, annealed copper. In the particular view provided in FIG. 5A, trace conductors 116 which are close to the surface of the top of coupon 74 are shown with dashed lines to indicate that they are actually partially visible due to the transparency of the material out of which coupon 74 is made.

Figure 5B:
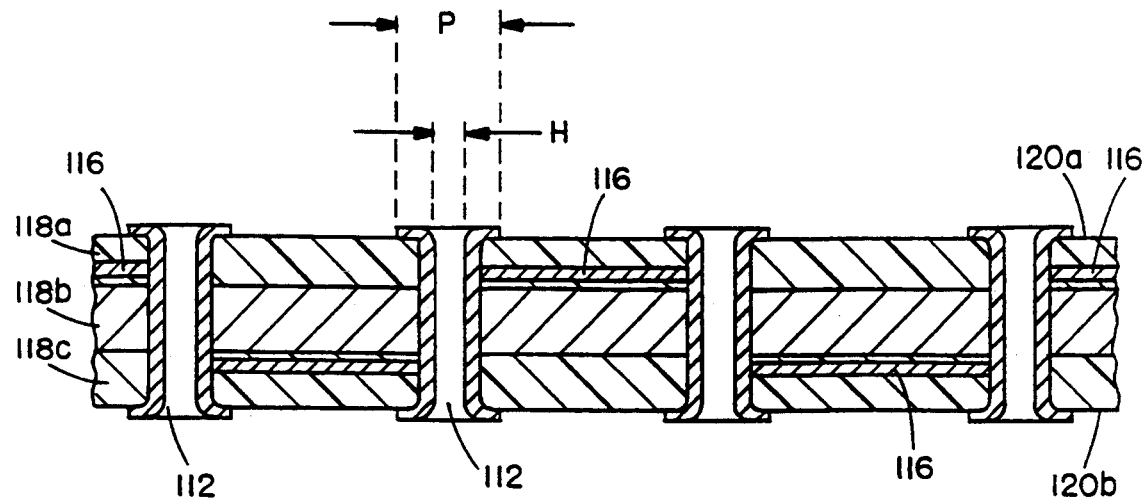

Referring to FIG. 5B, a side sectioned view of that portion of coupon 74 sectioned by reference line 5B in FIG. 5A provides a more detailed view of vias 112 and trace conductors 116. As seen from this partial view, trace conductors 116 interconnect adjoining vias 112, while vias 112 interconnect the two sides 120a, 120b of coupon 74. Through the interconnections formed by trace conductors 116, the one hundred and twelve vias 112 on coupon 74 are "daisy chained" together, with conductors 116 alternately positioned high and low, as shown on FIG. 5B.

FIG. 5B shows coupon 74 to be made of three layers 118a, 118b, 118c of the glass resin substrate. Additionally, FIG. 5B provides an illustration of the diameter of a representative via hole (H), which is typically between 0.008" and 0.040", with a preferred size of 0.013". The outer diameter of the via hole, referred to as the "pad" (P), is preferably 0.020" larger than H. Accordingly, if in a given embodiment H was equal to 0.013", for example, then P would preferably be sized to 0.033".

Figure 6A:
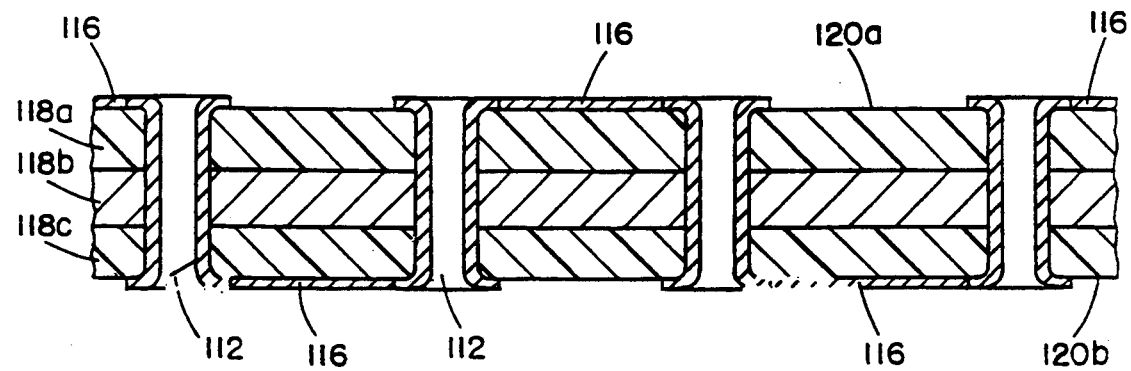
FIGS. 6A and 6B provide alternate embodiments of the IST coupon shown in FIG. 3.
Figure 6B:
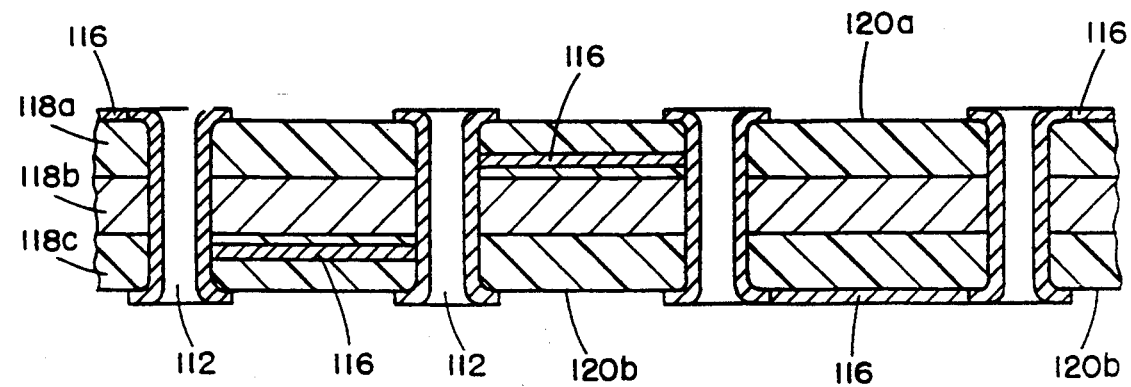

Referring now to FIGS. 6A and 6B, alternate embodiments of coupon 74 are shown in a view which is similar to FIG. 5B. In FIG. 6A, for example, trace conductors 116 are shown to be positioned on the external surfaces (top and bottom) of coupon 74, still serving to interlink vias 112 in the daisy chained fashion discussed in connection with FIGS. 5A and 5B. FIG. 6B shows yet another embodiment of coupon 74, however, in this configuration some of trace conductors 116 are positioned within the substrate, while others are positioned on the external surfaces of coupon 74. The trace conductors 116 in FIG. 6B also interconnect vias 112.

Referring back to FIG. 5A, one end of coupon 74 includes 4 connector vias, also having a 0.100" pitch. Connector via 122a is electrically coupled with the first via 112a, and connector via 122z is electrically coupled with the last via 112z, such that connector vias 122a, 122z define the two ends of a closed loop circuit which runs through all of the vias 112 of coupon 74. Accordingly, during stress testing a DC current will be passed through connector via 122a, then the interlinked vias 112, and ultimately connector via 122z.

The other two connector vias 124a are also electrically coupled to vias 112. In particular, connector via 124a is coupled to the first via 112a, and connector via 124z is coupled to the last via 112z. The purpose of connector vias 124, however, is not to pass current, but rather to provide electrical contact points at either end of the closed loop circuit, through which voltage drops across the vias 112 can be measured when current is applied.

FIG. 5A also shows a 0.1.00" pitch four pin male connector 126 positioned above coupon 74, with one side of connector 126 adapted for insertion into the four connector vias 122a, z, 124a, z. In the preferred embodiment, the four pins 130 of male connector 126 are inserted into connector vias 122a, z, 124a, z after coupon 74 has been separated from the PWB with which it is associated (discussed below), and pins 130 are then soldered in place. With male connector 126 affixed to coupon 74, coupon 74 can be connected with connector cable 72, as shown in FIG. 3.

In the preferred embodiment, connector cable 72 is the physical medium through which coupon 74 is coupled to bus 104 and bus 106. Though not detailed in any of the drawings, connector cable 72 has a female connector which is matingly configured such that pins 130 of male connector 126 are inserted therein. Thus, connector vias 122a, 122z are coupled to power supply 50 over bus 106, shown on FIG. 4, through connector cable 72. Therefore, power supply 50 has a physical connection with connector vias 122a, 122z over which DC electric current can be transmitted to vias 112 of coupon 74. Additionally, connector vias 124a, 124z are coupled to microvoltmeter 52 through buses 104 and 102, shown on FIG. 4, by means of connector cable 72. In this manner, microvoltmeter 52 has a physical connection through which it can measure the voltage drop across vias 112 when current is passed through vias 112 by power supply 50.

As indicated above, a test coupon, such as coupon 74, is manufactured as an integral part of an associated PWB, and is subject to the same manufacturing conditions and processes as the PWB. Thus, after such manufacturing and processing, coupon 74 can be used as a scientifically reliable test vehicle for testing the integrity and longevity of the associated PWB. FIG. 7 provides a general, block style illustration showing panel 125, which is largely made up of a printed wiring board 127. Board 127 has many conductive vias 129, which are formed in the same manner as vias 112, 115 discussed above, and which serve as the conductive connectors for the components (not shown) that are eventually mounted on board 127. Typically, an average PWB has between 1,000–12,000 such vias 129.

Also shown on FIG. 7 are twelve coupons 74, having been integrally manufactured as part of panel 125 which includes board 127. In FIG. 7 coupons 74 are positioned on the periphery of the sides of board 127. When panel 125 is processed, the perimeter of each coupon 74 can be cut, or V-grooved, so that coupons 74 are relatively easily detached from board 127 and the other adjoining coupons 74. For example, some such processing of panel 125 results in the coupons being attached to board 125 and adjoining coupons 74 by means of a "breakaway" tab, such that each coupon 74 can be manually snapped apart.

As a result of the positioning of the vias on coupon 74, the interlinked vias 112 in any given row, either 110a or 110b, will not cause the heating of the vias 112 in an adjoining row, during stress testing. In other words, vias 112 in row 110a do not thermally effect vias 112 in rows 110b, and vice versa. Thus, the vias in rows 110a, 110b are effectively thermally isolated from one another.

This can be contrasted with other coupon designs which have multiple rows of interconnected vias which are spaced closely enough so that when current is passed through them adjoining rows of vias will have a tendency to elevate the temperature of one another. The consequence of such a design is that the coupon tends to have a so-called "hot spot", often in its center Furthermore, the vias in the area of such high heat concentration tend to function as a "weak link" in the test vehicle, due to the fact that such vias experience far greater stresses than the vias situated in a coupon area where the temperature is significantly lower. Although there may be many vias on such a coupon, the different test conditions caused by the hot spot effectively reduce the number of vias being tested to significantly fewer than the total number. Namely, the vias in the highest temperature area, or the "weak link" vias, are virtually the only ones tested because the greater stresses usually cause them to fail first.

The overall objective of the stress test is to elevate the temperature of the vias and surrounding material to a specific temperature above the transitional temperature of the substrate forming coupon 74. For example, in a preferred embodiment the coupon substrate is a tetra-functional FR4, having a glass transitional temperature (Tg) of 135° C. If only some of the test vias are elevated above Tg, then only those will experience the stresses which are representative of the stresses board vias experience during processing and actual use.

The stress testing of significantly fewer than the total number of vias on the coupon may call into question the reliability of such a test. Test coupons are generally designed to provide a scientifically representative sampling of the vias 129 that are on board 127. Standards organizations within the PWB interconnect industry have established that a given coupon should have at least one hundred test vias. This is to insure that inherent defects in the interconnects of the associated board will be revealed with a satisfactory level of probability by testing at least one hundred test vias.

For purposes of this detailed description, a "test via" is a coupon via, the performance of which during stress testing is relied upon for ensuring enough vias are tested so that scientifically reliable data relating to the associated board is derived. In the particular embodiment discussed in this detailed description coupon 74 has one hundred and twelve vias 112. It is understood, however, that not all one hundred and twelve vias 112 are "test vias" because the coupon is designed such that six vias 112 at either end of coupon 74 are excluded from the test sample because the thermal characteristics of the end vias 112 are affected by being physically positioned so close to the edge. In particular, the three vias 112 at either end of row 110a and the three vias 112 at either end of row 110b will remain cooler than the remaining one hundred vias 112 more centrally located on coupon 74. Therefore, these twelve end vias 112 on coupon 74 are not considered "test vias". Nonetheless, even though these twelve end vias 112 are eliminated from the test sample, coupon 74 still includes one hundred vias 112 that are test vias. Using industry recognized guidelines, this is a large enough population from which statistically meaningful data relating to vias 129 on board 127 may be derived.

Referring back to coupon designs in which adjoining rows of vias tend to heat one another, using thermographics and thermo-couples it has been found that the temperature of the test vias and the substrate material surrounding the test vias on such coupons tend to vary as much as ±40° C. In one such test, the temperatures were measured at the portion of the coupon between two adjoining test vias. On the other hand, using the same measurement techniques, it has been found that the temperature of the test vias 112 of coupon 74 and the substrate material surrounding the test vias is generally uniform. In particular, the test vias and the substrate surrounding the test vias did not vary more than ±5° C. As a result of this generally uniform heat dissipation by coupon 74 in the region of the test vias 112, test vias 112 are all generally subjected to the same stresses. Therefore, each of the test vias on coupon 74 provide scientifically meaningful information relating to board 127. Given that each test via 112 experiences approximately the same temperature when DC current is passed through it, there is no hot spot which will distort the data derived in the test.

C. The Stress Testing Process.

Having described the major components which make up IST system 20 and IST coupon 74, this detailed description will now turn to a discussion of the means by which IST system 20 tests coupons 74. As indicated above, in the particular embodiment shown in FIG. 1, IST system 20 is capable of testing six coupons 74 at once. FIGS. 8-11 include block and flow diagrams which show the process by which the testing of up to six coupons is accomplished.

Referring first to FIG. 8, a block diagram is provided which generally shows the major process options available to operator 36 through IST system 20. As a programmable computer, computer 26 includes the ability to store and process information, and present operator 36 with pre-programmed options in the form of screen menus.

As shown in FIG. 1, IST system 20 includes an operator interface, such as computer system 22, which includes video monitor 32 for operator 36 to be presented with certain information visually, and keyboard 24 for operator 36 to provide operator input, such as by making selections from menu options presented on video monitor 32 or entering data by use of keyboard 24. In FIG. 8, operator interface 130 provides direct or indirect access to three basic features of IST system 20, namely Pre-Cycling 132, Stress Cycling 134, and General Utilities 136, each of which will be detailed below.

D. Pre-Cycling.

As shown in FIG. 8, one of the options of operator 36 is to enter the Pre-Cycling feature 132 of IST system 20. Generally, the objective of this portion of the process is to have IST system 20 determine the specific current ("CURTEST") that is to be applied to specific coupons 74 during actual stress testing. As indicated above, the application of CURTEST will have the effect of causing vias 112 and their surrounding PWB material to heat to a specific temperature. In order to determine the proper, respective CURTEST for each coupon, IST system 20 will have to compute the value of a number of different variables, as well as a number of intermediate CURTEST values.

For purposes of this detailed description, it will be assumed that six coupons 74 have been connected and mounted in their respective heads 56 and coupled with respective coupon cables 72, as illustrated in FIGS. 1 and 3. However, the detailed explanation will tend to focus upon the way in which IST system 20 processes one single coupon 74, such as coupon 74a in FIG. 4, understanding that the other five coupons would be processed in a similar manner.

In the preferred embodiment, IST system 20 commences the pre-cycling portion of the stress test by prompting operator 36 to enter certain data. The data listed in Table A is generally the type of information needed by computer 26. In a given practical implementation of the invention, such data may be input by operator 36, or the specific values for certain variables in Table A may be established in the software of computer 26. Furthermore, it may be possible to have some or all of such data accessed by computer 26 from an existing file in its memory.

TABLE A

COUPONS—the number of coupons to be tested;

CYCLEMAX—the number of stress cycles that determine the end of the stress test for a given coupon.

HITEMP—the upper temperature to which the coupon is to be tested;

RESDELTA—an elevated resistance rejection delta expressed as a percentage;

COUNTERMAX—the maximum number of trials a given coupon will be pre-cycled in order to establish the correct current at which it will be stress tested;

CLOCKMAX—the amount of time that coupons will have current run through them during stress cycling;

CURTABLE—the name of a current table which contains an initial current value for pre-cycling coupons; and COOLTIME—the amount of time that coupons will be cooled.

Further details on the function of this information will be made clearer in this detailed description. Any such data that is input by operator 36 will be stored in the memory of computer 26 and used by computer 26 in the manner discussed below. On the other hand, operator 36 could access an existing file which contains the same type of previously stored data through the General Utilities feature 136 of IST system 20, which will be further discussed below.

Figure 9A:
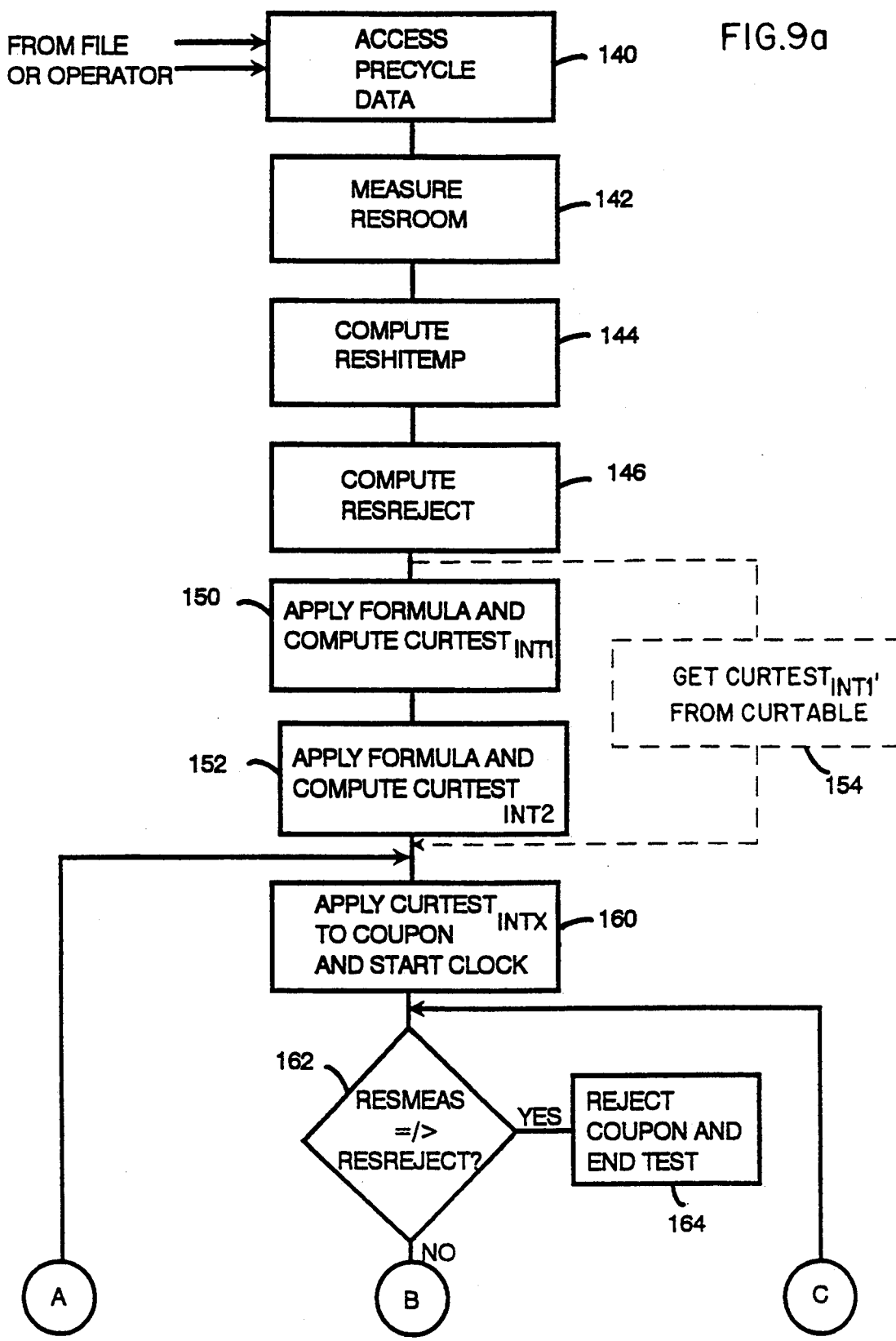
FIGS. 9(a) and 9(b) provides a flow diagram of the process by which the IST system of FIG. 1 determines the current at which a coupon is tested.
Figure 9B:
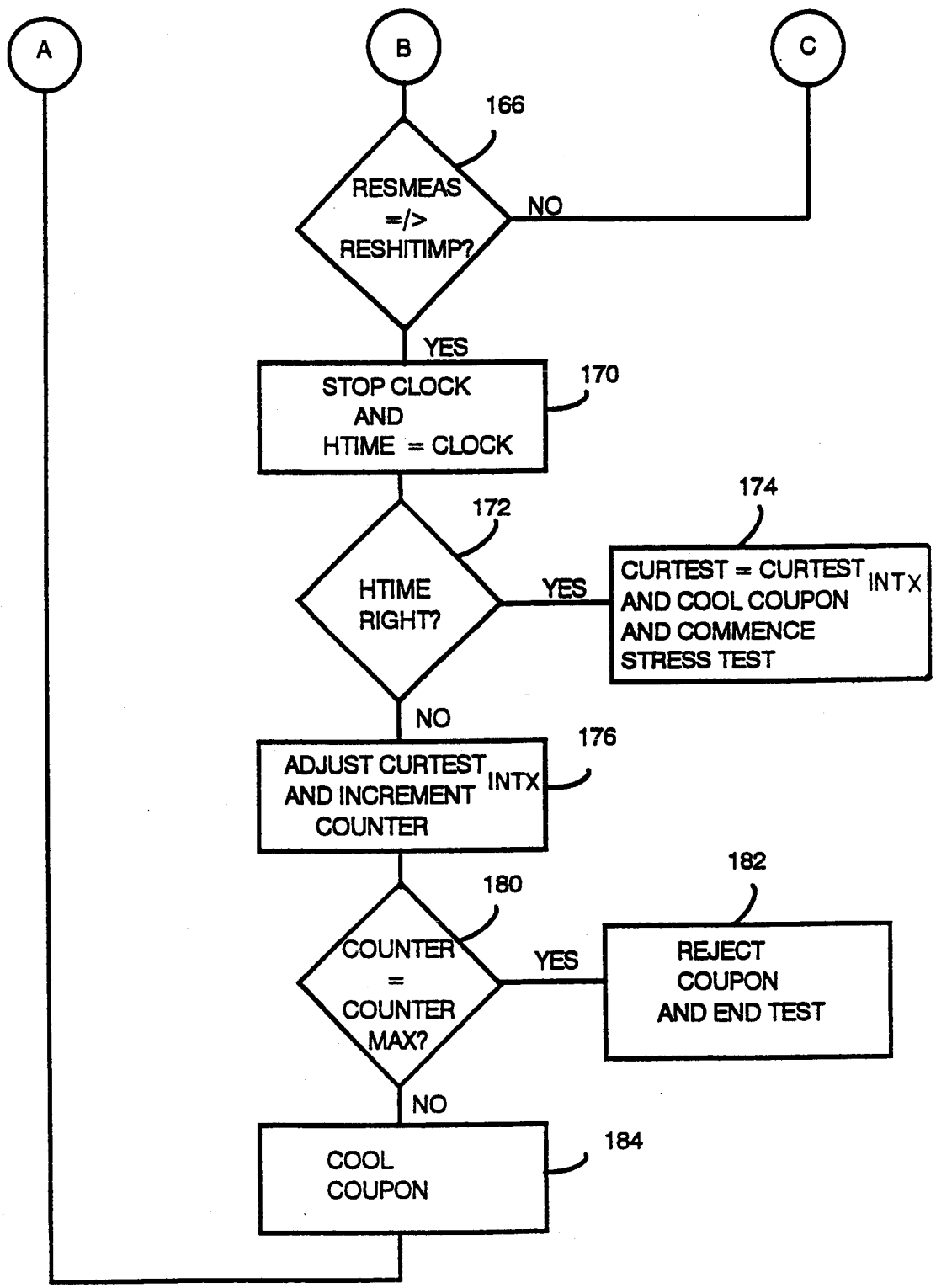

Referring now to FIGS. 9(a) and 9(b), it is seen that the pre-cycling process begins with IST system 20 accessing pre-cycle data (step 140), which is provided by operator 36 or can be accessed in a preexisting file, as described. After the data is accessed, IST system 20 will continue the pre-cycling function by measuring the resistance of coupon 74a at ambient (room temperature) ("RESTROOM")(step 142), which is typically approximately 22° C. As discussed above, the measurement of the resistance of coupon 74a can be made by applying a given current to coupon 74a through power supply 50, and measuring the voltage drop across coupon 74a using microvoltmeter 52, both power supply 50 and microvoltmeter 52 being shown in FIGS. 2 and 4, above.

In the preferred embodiment, power supply 50 will be programmed to run approximately 100 mA through coupon 74, and, using known physical laws such as Ohm's law, RESROOM is determined. The measurement of RESROOM should made down to the milliohm level, with an overall accuracy of ±0.8%. On the other hand, if the particular equipment referenced above, namely the Keithly voltmeter and the Farnell power supply, are used in a given embodiment of the IST system 20, it may be desirable to use the calibration technique, described below in the General Utilities section, in order to insure that the measurement of RESROOM is accurate.

Using RESROOM, IST system 20 next computes what the resistance of coupon 74a should be at the elevated temperature HITEMP, which is referred to as "RESHITEMP" and which is then stored in the memory of computer 26 (step 144). More specifically, computer 26 computes RESHITEMP using the following equation:

$$\text{RESHITEMP} = \{(\text{TCR} \times \text{RESROOM} \times \text{HITEMP}) + \text{RESROOM}\}/1.1$$

where "TCR" is the thermal coefficient of resistance for copper, which, in the preferred embodiment, is the material out of which vias 112 of coupon 74a are made. (Equation I.)

It should be noted at this point that during the operation of computer 26 a number of values will be computed, such as RESHITEMP, for example. Depending upon the particular computer that is used, such values can be produced by either implementing a conventional, arithmetic, hardware circuit, or equivalent software code. By either means, computer 26 is able to produce the values needed.

IST system 20 next computes the resistance value ("RESREJECT") at which coupon 74a will be rejected by IST system 20 on the grounds that coupon 74a has exceeded a maximum resistance threshold, and is therefore predictably bound for failure (step 146). In other words, if during actual stress testing the resistance of coupon 74a is ever measured by IST system 20 to have reached RESREJECT, then IST system 20 will cease any further cycling of that coupon based on the assumption that the resistance is so high that significant materials failure has occurred, and testing should not be continued. Computer 26 determines RESREJECT by implementing the following equation:

$$\text{RESREJECT} = \text{RESHITEMP} \times \text{RESDELTA}. \quad \text{(Equation II.)}$$

For example, if RESHITEMP equals 400 milliohms and RESDELTA equals 110%, RESREJECT equals 440 milliohms. After RESHITEMP and RESREJECT are computed by computer 26 they are then stored with the other data, discussed above, in the memory of computer 26.

Having computed these values with respect to coupon 74a, IST system 20 is now in a position to compute CURTEST, namely that current value which will be applied to coupon 74a during stress testing. In order to do so, IST system 20 may use an iterative process through which a first order approximation selected by IST system 20 is progressively refined to eventually settle upon the final CURTEST. The number of iterations are dependent on how close the first approximation is to the final CURTEST value. During this iterative process a number of intermediate CURTEST values are produced, which will be referred to as "CURTEST$_{intx}$", where "x" represents a variable which changes based on the number of times an intermediate CURTEST value is refined in the IST system 20 to eventually establish the final CURTEST value.

In the preferred embodiment, IST system 20 determines the first, intermediate current, CURTEST$_{int1}$ (step 150), by having computer 26 implement the following equation:

$$\text{CURTEST}_{int1} = \{(-0.010872 \times \text{RESROOM}) + 9.086003\} \quad \text{(Equation III.)}$$

Computer 26 then further refines CURTEST$_{int1}$ on the basis of the maximum temperature, HITEMP, to which coupon 74a will be raised during stress testing (step 152). In particular, computer 26 implements the following equation:

$$\text{CURTEST}_{int2} = \text{CURTEST}_{int1} + 0.0185 \text{ amps per degree for each degree HITEMP is greater than } 150° \text{ C};$$

$CURTEST_{int2} = CURTEST_{int1} - 0.0185$ amps per degree for each degree HITEMP is less than 150° C; and $CURTEST_{int2} = CURTEST_{int1}$, if HITEMP = 150° C. (Equation IV.)

Thus, in the preferred embodiment, IST system 20 actually uses this two step process to determine the CURTEST$_{intx}$ that is then run through coupon 74a, and possibly further refined depending on certain test results, discussed below.

In another embodiment of the invention, instead of computing CURTEST$_{intx}$ by means of Equations III and IV, it is also possible to use data acquired from previous tests to determine the CURTEST$_{intx}$ which is initially used by IST system 20, and possibly further refined. For example, operator 36 could accumulate electric current values from previous test samplings of coupons, and arrange them in a tabular form such that the table could be accessed to give the first approximation of CURTEST$_{intx}$. In this manner, IST system 20 can be a highly versatile tool for customized coupon testing.

One such example of using empirical data arranged in tabular form is provided in FIG. 10. It has been found that if HITEMP is approximately 160° C., then the ranges provided in the Table of FIG. 10 provide a fair approximation of CURTEST$_{intx}$. Referring to FIGS. 9(a) and 9(b), if IST system 20 were to implement this alternate approach, CURTEST$_{intx}$ would be taken from a CURTABLE (step 154), which was one of the data elements entered by operator 36 in Table A, above.

To the extent that taking CURTEST$_{int1'}$ from CURTABLE is an alternative approach to deriving CURTEST$_{int1}$ from Equations III and IV, FIGS. 9(a) and 9(b) illustrates the alternate approach by showing step 154 in dashed lines. On the other hand, from FIG. 9 it can be seen that if the alternate approach is used, CURTEST$_{int1'}$ enters the flow diagram in the same point as CURTEST$_{int2}$, and is further processed by IST system 20 in the same manner as CURTEST$_{int2}$.

Referring once again to FIG. 10, the table is used such that the value of RESROOM, which is computed in step 142 of FIG. 9(a) and 9(b), is determined to fit within a given resistance range. Each such range has a CURTEST$_{int1'}$ associated with it, such that the associated CURTEST$_{int1'}$ would be the first, intermediate CURTEST used. For example, if RESROOM of coupon 74a was determined to be 295 milliohms, which falls within the range 290-300 milliohms, then the table in FIG. 10 indicates that CURTEST$_{int1'}$ would be 5.77 amps. IST system 20 would then use 5.77 amps as the first, intermediate CURTEST value. Although this alternate method of having IST system 20 access CURTEST$_{int1'}$ from a table has been described, this detailed description will continue based on the assumption that in the preferred embodiment IST system 20 determines CURTEST$_{intx}$ using Equations III and IV.

Referring back to FIGS. 9(a) and 9(b), IST system 20 further processes CURTEST$_{int2}$ to determine whether that particular current value is the correct current value to be applied during the actual stress test of coupon 74a. As shown in FIGS. 9(a) and 9(b), after CURTEST$_{int2}$ is determined, IST system 20 next applies CURTEST$_{int2}$ to coupon 74a using power supply 50 (step 160), and simultaneously starts clock 94, shown in FIG. 4, to measure the time. As CURTEST$_{int2}$ is run through vias 112 of coupon 74a, coupon 74a will naturally heat up, which will cause its resistance characteristics to change. Generally speaking, the resistance value of coupon 74a will increase as it gets hotter. Throughout the heating of coupon 74a, IST system 20 will continue to measure its actual resistance ("RESMEAS") using microvoltmeter 52.

As indicated above, computer 26 will have previously computed a resistance rejection criteria, which is RESREJECT. While DC current is being run through coupon 74a, computer 26 will test RESEMEAS to determine if it is equal to or greater than RESREJECT (decision block 162). If it is, then there is probably some serious defect in coupon 74a and computer 26 will reject it (step 164).

On the other hand, so long as decision block continues to be answered in the negative, computer 26 will continue to query whether RESMEAS is equal to or greater than RESHITEMP (decision block 166). Due to the fact that coupon 74a is progressively heating and RESMEAS is increasing, eventually decision block 166 will be answered in the affirmative. At that point, clock 94 will be stopped and the measured time of heating ("HTIME")is set equal to the value of clock 94 (step 170).

Next, FIGS. 9(a) and 9(b) shows that IST system 20 tests HTIME to determine if it is right (step 172). In this context, HTIME is "right" if it falls within a certain accepted range of time values. For example, in one embodiment of the stress testing system, it may be desirable to find the CURTEST which, when applied, will elevate RESMEAS to RESHITEMP in three minutes ± five seconds. Therefore, in this particular example, a HTIME falling between 2:55 and 3:05 would be acceptable, or "right" in the terms of decision block 172. If HTIME falls outside this particular range, then IST system 20 will have to further refine CURTEST$_{int2}$.

In order to determine whether HTIME does not fall within the established range, computer 26 tests HTIME using the following:

If HTIME < HTIMEHI and HTIME > HTIMELO, then CURTEST = CURTEST$_{intx}$, where HTIMEHI is the upper time limit, such as 3:05, and HTIMELO is the lower time limit, such as 2:55, as described above. (Equation V.)

It should be noted that Equation V is written in a more general form insofar as CURTEST is made equal to CURTEST$_{intx}$, rather than CURTEST$_{int2}$. This is to indicate that whatever the intermediate current value is at the point in the iterative process when HTIME is found to fall between HTIMEHI and HTIMELO will be the value of CURTEST. As will be described, it is possible that several refinements of CURTEST$_{intx}$ may occur before HTIME fits within the range between HTIMEHI and HTIMELO.

As seen from FIG. 9(a) and 9(b), if HTIME is right, meaning in this embodiment that HTIME is less than HTIMEHI and HTIME is greater than HTIMELO, then decision block 172 is answered in the affirmative. This affirmative answer results in CURTEST being set equal to CURTEST$_{intx}$, and coupon 74a being cooled (step 174). The cooling of coupon 74a is accomplished by means of computer 26 turning on the corresponding fan 64, shown in FIG. 2 and discussed above.

On the other hand, assuming Equation V is not satisfied because HTIME does not fall within the range of HTIMEHI and HTIMELO, computer 26 further tests the given HTIME value to determine how far off it was, and then adjust CURTEST$_{intx}$ accordingly (step 176). In particular, computer 26 performs the following tests on HTIME and makes the following adjustments:

If HTIME<HTIMELO−0.0122,
then al=−0.04;

If HTIME≧HTIMELO−0.0122 and HTIME<HTIMELO−0.0099,
then al=−0.03;

If HTIME≧HTIMELO−0.0099 and HTIME<HTIMELO−0.0076,
then al=−0.02;

If HTIME≧HTIMELO−.0076 and HTIME<HTIMELO−0.0053,
then al=−0.015;

If HTIME≧HTIMELO−0.0053 and HTIME<HTIMELO−0.004,
then al=0.01;

If HTIME≧HTIMELO−0.004 and HTIME<HTIMELO−0.003,
then al=−0.008;

If HTIME≧HTIMELO−0.003 and HTIME<HTIMELO−0.002,
then al=−0.006;

If HTIME≧HTIMELO−0.002 and HTIME<HTIMELO−0.001,
then al=−0.004;

If HTIME≧HTIMELO−0.001 AND HTIME<HTIMELO,
then al=−0.002;
and

CURTEST$_{intx}$=CURTEST$_{int(x−1)}$×(0.995 +al).

If HTIME>HTIMEHI,
then al=0;

If HTIME>HTIMEHI and HTIME≦HTIMEHI+0.001,
then al=0.002;

If HTIME>HTIMEHI+0.001 and HTIME≦HTIMEHI+0.002,
then al=0.004;

If HTIME>HTIMEHI+0.002 and HTIME≦HTIMEHI+0.003,
then al=0.006;

If HTIME>HTIMEHI+0.003 and HTIME≦HTIMEHI+0.004,
then al−0.008;

If HTIME>HTIMEHI+0.004 and HTIME≦HTIMEHI+0.005,
then al=0.01;

If HTIME>HTIMEHI+0.0053 and HTIME≦HTIMEHI+0.0076,
then al=0.015;

If HTIME>HTIMEHI+0.0076 and HTIME≦HTIMEHI+0.009,
then al=0.02;

If HTIME>HTIMEHI+0.0099 and HTIME≦HTIMEHI+0.01,
then al=0.03;

If HTIME>HTIMEHI+0.0122,
then al=0.04;
and

CURTEST$_{intx}$=CURTEST$_{int(x−1)}$×(1.005+al)(Equation VI.)

Accordingly, using the foregoing example, computer 26 will establish a new intermediate CURTEST value, namely CURTEST$_{int3}$, which will be available for further testing to determine if it is the proper current for testing coupon 74a during the actual stress test.

In addition, when CURTEST$_{int2}$ is modified in accordance with Equation VI to yield CURTEST$_{int3}$, computer 26 will also increment counter 96, shown in FIG. 4. As discussed above, one of the data elements of Table A was COUNTERMAX, which was identified as a value which indicates the number of times IST system 20 will attempt to find the proper CURTEST for a given coupon 74. In the preferred embodiment, COUNTERMAX is a fixed number that is programmed into the software of computer 26, which is recalled during processing operations.

Referring still to the flow diagram, after the first attempt, using CURTEST$_{int2}$, which in the example did not result in a HTIME which satisfies Equation V, counter 96 will be incremented. Next, IST system 20 tests counter 96 to determine if it equals COUNTERMAX (step 180). If it does, then computer 26 will reject coupon 74a on the grounds that it could not find the proper CURTEST to be applied during stress testing (step 182) within the allowed number of iterations. In the preferred embodiment, COUNTERMAX may be set to 10, for example, which means that computer 26 will test and refine CURTEST$_{intx}$ ten times before computer 26 concludes that it will make no further attempts with respect to the given coupon. It has been found that if the proper CURTEST cannot be found after several iterations, such as ten for example, then there is likely to be a defect in the coupon, and it is not worth further processing.

Assuming that the value of counter 96 has not yet reached COUNTERMAX, computer 26 cools coupon 74a, by turning on the corresponding fan 64 (step 184).

As seen by looking at FIG. 9, after coupon 74a is cooled, the process returns to the portion of the flow diagram where CURTEST$_{intx}$ is applied to coupon 74a. Consistent with the example developed above, at this stage of the process, the actual current value applied to coupon 74a is CURTEST$_{int3}$, which was derived from CURTEST$_{int2}$ using Equation VI, above. In accordance with the preferred embodiment of IST system 20, CURTEST$_{int3}$ may be processed in the manner described such that IST system 20 eventually produces CURTEST$_{int4}$, and CURTEST$_{int5}$, and so on.

Each such CURTEST$_{intx}$ value will be processed and the resulting HTIME will be tested in the same manner described. If the resulting HTIME does not fall within the range of Equation V, then the given CURTEST$_{intx}$ will be refined through Equation VI, such that it is expected that the proper CURTEST value will be determined before counter 96 is incremented to equal COUNTERMAX. If, on the other hand, this does not happen, and COUNTERMAX is achieved before HTIME falls within the range of Equation V, then computer 26 will reject the coupon and it will not be further processed to actual stress testing (step 182). Assuming that HTIME eventually does test properly, and decision block 172 is answered in the affirmative, CURTEST will be set equal to CURTEST$_{intx}$ in accordance with Equation V and as shown in step 174.

Although the discussion of the process by which CURTEST was determined has focused upon coupon 74a, it should be understood that at the same time that IST system 20 performed the pre-cycling tests on coupon 74a, the same procedures are likewise performed on the other five coupons 74. Recall that power supply 50, shown in FIGS. 2 and 4, is capable of supplying six different currents to six different coupons simultaneously. And, through controller 60, also in FIGS. 2 and 4, IST system 20 is able to multiplex the access of microvoltmeter 52 to the six coupons so that the voltage across all six coupons 74 is measured at approximately the same time. Although each of the six coupons 74 are subjected to their own independent testing procedure, in accordance with the process discussed in connection with coupon 74a, at the end of the procedure IST system 20 will have stored six CURTEST values, each corresponding to a coupons 74a-f.

During pre-cycling, however, any one of the six coupons 74 may have been rejected, as illustrated by decision blocks 164, 182 in FIGS. 9(a) and 9(b). In such a case, that given coupon 74 would not then be further processed by IST system 20, although the remaining coupons 74, which were not rejected, could be.

E Stress Cycling.

Thus far the discussion of the method by which IST system 20 implements the stress testing approach has focused upon the steps which are preliminary to the actual testing of coupons 74. These preliminary steps involve the process by which IST system 20 determines the CURTEST value for each of the six coupons 74 mounted in heads 56 on the top 54 of cabinet 44, shown in FIGS. 2 and 3.

Referring back to FIG. 8, it is shown that after the pre-cycling stage has been completed, stress cycling can next be commenced. In the preferred embodiment, IST system 20 automatically progresses from the pre-cycling stage to the stress cycling stage. Thus, IST system 20 commences the actual testing of coupons 74 by applying the respective CURTEST current values, which were determined through the pre-cycling stage, to each of the six coupons.

In the preferred embodiment, CURTEST is applied to a given coupon 74 for a predetermined period of time, which remains the same during each subsequent cycle, unless coupon 74 is determined to have exceeded certain rejection criteria. The application of DC electric current to vias 112 of coupon 74, shown in FIGS. 5A and 5B, will cause coupon 74a to heat up and undergo mechanical stress resulting from expansion. Thereafter, coupons 74 are cooled so that they then contract, resulting in mechanical contraction. Through such cyclic heating and cooling, coupons 74 will undergo the type of physical exercising that is experienced by the associated PWB, when the associated PWB is processed through component assembly and exposed to environmental thermal cycling in the field. The coupon, however, undergoes that exercising on a greatly accelerated basis due to the stress testing.

Figure 11:
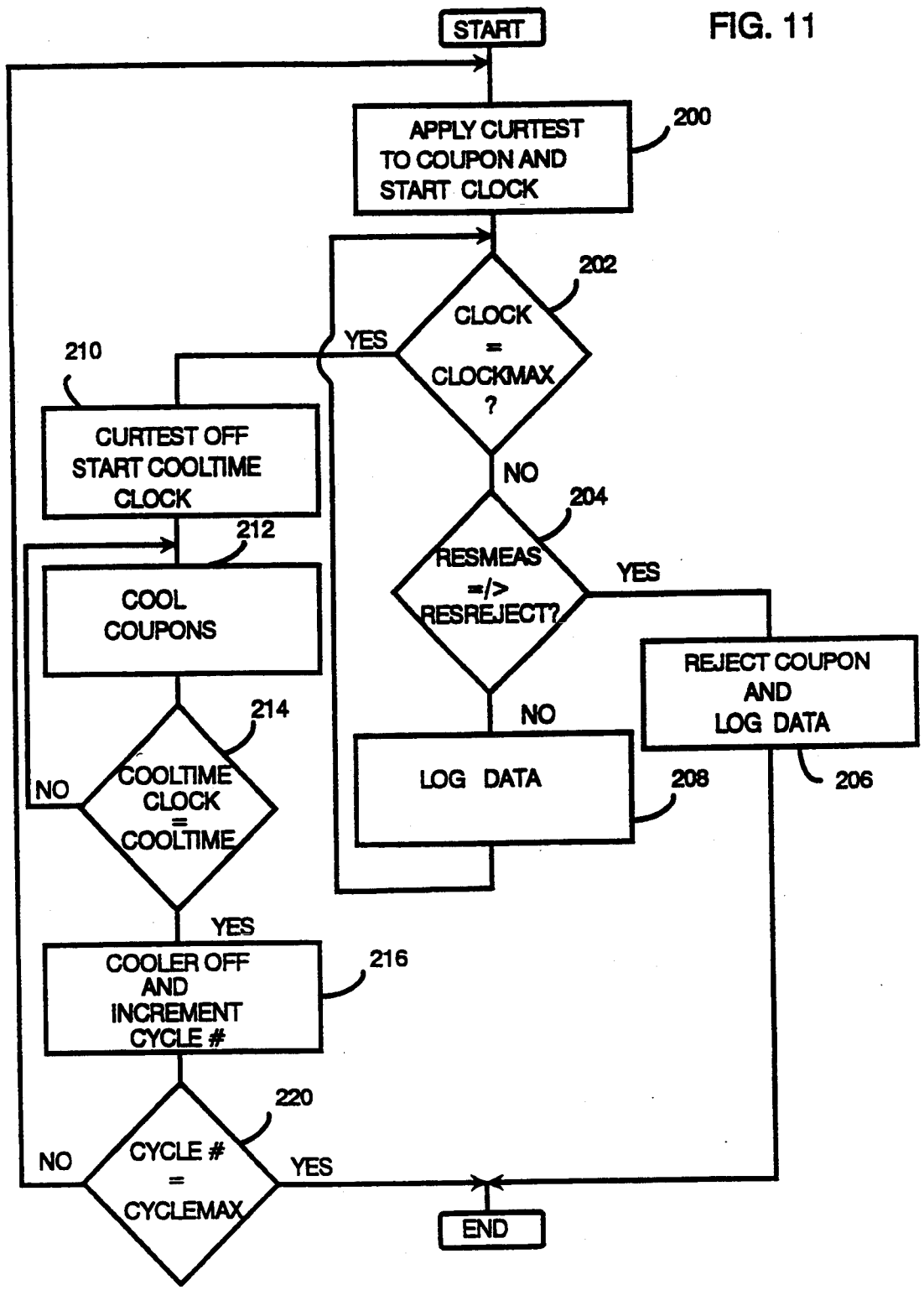
FIG. 11 provides a flow diagram of the process by which the IST system of FIG. 1 actually stress tests the coupon.

Referring now to FIG. 11, with coupons 74 mounted in head 56 on top 54 of cabinet 44, IST system 20 will next commence the stress cycling stage by applying the six CURTEST current values to the six respective coupons 74, those six CURTEST values having been determined during the pre-cycling stage. Like the discussion of the pre-cycling stage, the discussion of the stress cycling stage will focus upon one single coupon, while it should be understood that IST system 20 processes the other five coupons in the same manner.

To begin with, IST system 20 commences the process by applying CURTEST to coupon 74a, and simultaneously starting clock 94 to time the duration of the application of the current (step 200). Subject to the occurrence of certain events discussed below, IST system 20 will apply CURTEST to coupon 74a for 3 minutes (+5/−0 seconds), which in this embodiment is CLOCKMAX, during the heating portion of every cycle. Consequently, IST system 20 will apply CURTEST to coupon 74a for 3 minutes during the heating portion of every cycle, until CYCLEMAX or RESREJECT is reached.

As shown on FIG. 11, while CURTEST is applied to coupon 74a, IST system 20 tests clock 94 to determine if it is equal to CLOCKMAX (decision block 202). Assuming that it is not, because CURTEST has been applied for less than 3 minutes, in this example, IST system 20 will then test whether RESMEAS is equal to or greater than RESREJECT (decision block 204).

Recall that RESREJECT was computed during the pre-cycling stage to establish an upper limit of the resistance of coupon 74a, beyond which IST system 20 will no longer process it. As shown by the flow diagram of FIG. 11, if during the 3 minute heating cycle RESEMEAS equals or exceeds RESREJECT, then IST system 20 will answer decision block in the affirmative. At that point, coupon 74a will be rejected, and computer 26 will log certain data relating to coupon 74a (step 206). For example, computer 26 may log data relating to the measured resistance at the time of rejection, number of cycles completed, the actual time of rejection, and so on.

Assuming that RESMEAS does not exceed RESREJECT, such that decision block 204 is answered in the negative, IST system 20 will continuously log data relating to coupon 74a as CURTEST is run through it (step 208). The data logged relates to CURTEST and RESMEAS at specific times.

In the preferred embodiment, controller 60 multiplexes microvoltmeter 52 so that voltmeter reads the voltage drop across each of the six coupons 74a-f about once every 8 seconds. Although computer 26 could therefore save all of the information accumulated with respect to coupon 74a and the other five coupons, it would require considerable allocation of memory space in computer 26. Furthermore, it has been found that an adequate sampling of the behavior of coupons can be made by actually saving only portion of the data amassed during stress testing. Accordingly, computer 26 can be programmed to save the data relating to coupon 74a in specific multiples of cycle numbers, so that data is saved on the 5th, 10th, 15th cycle, or the 3rd, 6th, 9th cycle, and so on. Even though not complete, such information provides a meaningful profile of changes in the resistance properties of coupon 74a as it is cycled over time.

To the extent that clock 94 is started when CURTEST is applied to coupon 74a, and assuming coupon 74a does not fail by having RESMEAS exceed RESREJECT, eventually decision block 202 will be answered in the affirmative. In the previous example, this will happen when clock 94 equals three minutes. In the meanwhile, data relating to coupon 74a will have been accumulated periodically by IST system 20 during the three minutes.

After the three minutes are over, CURTEST will be shut off by computer 26, and clock 94 will be started so that it measures the amount of time that coupon 74a is cooled (step 210). At this time, computer 26 will turn on the fan 64 corresponding to coupon 74a (step 212) so that coupon 74a is cooled to approximately room temperature. IST system 20 will continue to test clock 94 to determine whether it has reached COOLTIME, which was set in Table A (decision block 214). When clock 94 is equal to COOLTIME, decision block 214 is answered in the affirmative, resulting in fan 64 being turned off and counter 96 incremented (step 216).

Next, IST system 20 tests counter 96 to determine if it is equal to CYCLEMAX (decision block 220), which is the maximum number of cycles that operator 36 programmed computer 26 to test coupons 74 in Table A. If counter 96 does not equal CYCLEMAX, then IST system 20 returns to the commencement of the testing process and once again applies CURTEST to coupon 74a for another three minutes, in the manner described in the flow diagram of FIG. 11.

As seen in FIG. 11, once coupon 74a is rejected because RESMEAS is greater than RESREJECT, or once counter 96 shows that CYCLEMAX has been exceeded, the stress cycling portion of the testing is completed. Assuming that CYCLEMAX was in fact achieved, then IST system 20 will have successfully cycled coupon 74a through the number of cycles that operator 36 had requested. Furthermore, during the cycles, computer 26 will have accumulated and saved the information which reflects the response of coupon 74a to the application of CURTEST. That information can then be analyzed for the purpose of determining the useful life of the PWB with which coupon 74a is associated.

G. General Utilities.

Referring once again to FIG. 8, one of the options that operator 36 has, in addition to the Pre-cycling 132 and Stress Cycling 134 features of IST system 20, is a General Utilities 136 feature. Given that computer system 22 is a general purpose personal computer, the General Utilities feature of IST system 20 offers operator 36 a number of options which are commonly available on general computing devices. For example, through the General Utilities feature, operator 36 is able to store files that have been created previously. Operator 36 is also able to input data, such as the type of data shown in Table A, above, and create and customize a file that can be accessed by operator 36 sometime in the future. Operator 36 can also interrupt coupon testing and restart the test after interruption. Likewise, data resulting from pre-cycling or stress cycling can be stored in a file. After such storage, computer 26 allows operator 36 to access, or read, stored files so that the information contained therein can be analyzed, or used in some other manner.

Through the General Utilities feature of IST system 20 operator 36 also may be able to sort files and data, and turn on and off fans 64, shown in FIG. 2.

A further option available to operator 36 is a calibration feature which is used with the particular components which comprise the preferred embodiment of the IST system 20. Recall that during the pre-cycling stage, computer 26 computed a number of values based upon its measurement and computation of RESROOM, the measured resistance value of coupon 74a at room temperature. As indicated, RESROOM is measured down to the milliohm level, with an overall accuracy of ±−0.8%. On the other hand, the particular equipment used in the preferred embodiment is not capable of measuring to this level of accuracy. Therefore, inaccuracy of the Keithly voltmeter and Farnell power supply can be accommodated by means of using a calibration technique to account for the imprecision. Or, an alternate embodiment of IST system 20 could include a power supply and voltmeter which measures to this level of accuracy in the pre-cycling stage.

In the preferred embodiment of IST system 20, the General Utilities feature shown in FIG. 8 provides operator 36 with the option of calibrating the IST system 20 equipment so that the proper accuracies can be achieved when measuring RESROOM during the pre-cycling stage, described above. The calibration of the equipment can be done on a regular basis, such as every month of use of IST system 20. It can also be used after the occurrence of a power outage, software upgrade, or hardware modification.

The particular calibration technique which has been found to produce satisfactory results requires the use of a calibration device which has a known or standard resistance, $R_{standard}$. For purposes of this discussion it will be assumed that $R_{standard} = 200$ mOhms $= -0.5\%$. In order to perform the calibration, operator will couple $R_{standard}$ to one of the connector cables 72, as shown on FIG. 3, in place of a coupon 74.

It will be further assumed that the target current, $I_{target}$, that operator 36 would like power supply 50 to output is 100 mA; however, due to the accuracy limitations of the Farnell power supply 50, it is not guaranteed that it will output this particular current when programmed to do so. Nonetheless, operator 36 will program power supply 50 to run a first current, namely $I_{program}$, through the standard resistance device. In the particular implementation computer 26 is programmed to select an $I_{program}$ which is slightly less than $I_{target}$, and run it through the resistance device while IST system 20 measures the voltage drop, $V_{measured}$, across the device using microvoltmeter 52.

In doing so, IST system 20 can then measure the actual current, $I_{actual}$, that is being output by power supply 50 using the equation:

$$I_{actual} = V_{measured}/R_{standard} \qquad \text{(Equation VII.)}$$

Computer 26 is then in a position to assess how close $I_{actual}$ is to $I_{target}$. Assuming that $I_{actual}$ is too far away from $I_{target}$, computer 26 may use an iterative process by which $I_{program}$ is modified up or down until $I_{actual}$ is as close to $I_{target}$ as is possible. At the point where computer 26 determines that $I_{actual}$ is as close to $I_{target}$ as possible, the final actual current is provided by:

$$I_{actual\,final} = V_{measured\,final}/R_{standard} \qquad \text{(Equation VIII.)}$$

Computer 26 next uses $V_{measured\,final}$ to compute a measured resistance value, $R_{measured}$, for the standard resistance device, where:

$$R_{measured} = V_{measured\,final}/I_{target} \qquad \text{(Equation IX.)}$$

Using this measured resistance, computer 26 next computes a resistance error factor, $R_{error}$, where:

$$R_{error} = R_{standard} - R_{measured} \qquad \text{(Equation X.)}$$

Through this calibration technique, two of the factors that are generated, namely $R_{error}$ and $I_{actual\,final}$ are ultimately used to insure proper measurements to the level accuracy needed during the pre-cycling stage. Recall that in the discussion of the pre-cycling stage above, it was indicated that in order to determine RESROOM, in the preferred embodiment IST system 20 ran through coupon 74 approximately 100 mA of current. From the foregoing, however, it is seen that even though 100 mA is the target output current, power supply 50 will not necessarily produce that specific current. Using the calibration technique discussed it is possible to determine actual final, which is quite close to the target current of 100 mA, in this particular example.

Therefore, in order to measure RESROOM of coupons 74 during the pre-cycling stage, IST system 20 will apply $I_{actual\ final}$ to coupon 74 as the current that is run through it when measuring the voltage drop across it. Furthermore, when IST system 20 computes the resistance of coupon 74, using Ohm's law, it will then add $R_{error}$ to that computed value, which will then yield RESROOM. Accordingly, through this calibration technique, the measurements of RESROOM during the pre-cycling stage can be made to the level of accuracy needed, even with the Keithly and the Farnell equipment used in IST system 20.

Although the preferred method of providing calibration has been described, in other embodiments of IST system 20 different calibration techniques may be employed. Alternatively, in other embodiments, IST system 20 may use different power sources and voltage meters having the requisite degree of accuracy needed for measuring RESROOM. Also, it is possible for IST system 20 to be implemented using combinations of different voltmeters and power supplies, some of which may be used during pre-cycling, and others used during stress cycling.

G. Summary.

In addition to the accuracy, ease of use, and flexibility of IST system 20, the system has proven to correlate well with the current Mil-T test approach. For example, the following correlation has been found to exist between the stresses placed on coupon 74 resulting from IST stress testing and Mil-T stress testing.

TABLE B

| HITEMP °C. | # Mil-T cycles | # IST cycles |
|---|---|---|
| 140 | 1 | 1.5 |
| 150 | 1.5 | 1 |
| 160 | 2 | 1 |
| 180 | 3 | 1 |

Thus, it can be seen that stress testing using the IST system 20 can be correlated to, and therefore operate as a cost efficient substitute for the Mil-T approach.

Also, the detailed description has provided particular embodiments of IST system 20. Certain equipment and components have been described, and the flow diagrams have described the process by which coupons 74 are tested. In other embodiments of the invention, different components could be used. For example, in other embodiments power supplies having the ability to provide a greater number of test currents could be used. Furthermore, although the flow diagrams have presented the pre-cycling and cycling processes which could be implemented in software, it is known by those skilled in the computer arts that software instructions can be implemented in hardwired circuits. Thus, in another embodiment of IST system 20 the software code which accomplishes the operation of IST system 20 could be implemented in the hardwired logic circuits of a specialized computing device.

Accordingly, the present invention in its broader aspects is therefore not limited to the specific details, representative apparatus, and illustrative examples shown and described herein. Departures may be made from such details without departing from the spirit or scope of the invention.

What is claimed is:

1. A printed wiring board coupon comprising:
   a substrate; and
   a plurality of vias, said vias comprising electrically interconnected test vias which are arranged in said substrate such that when a stress test current is applied to said test vias, the heat dissipated by each of said test vias does not contribute to the heating of the other test vias, the test vias thereby remaining thermally isolated from one another.

2. The coupon as in claim 1 wherein said test vias are arranged in first and second rows.

3. The coupon as in claim 2 wherein said first and second rows are parallel.

4. The coupon as in claim 3 wherein said first row is positioned in between third and fourth rows of vias, which are not electrically interconnected with said test vias, said fourth row positioned between said first and second rows.

5. The coupon as in claim 1 wherein first and second test vias are electrically interconnected by means of a trace conductor which is mounted within said substrate.

6. The coupon as in claim 1 wherein first and second test vias are electrically interconnected by means of a trace conductor which is mounted on an external surface of said substrate.

7. A printed wiring board coupon comprising:
   a substrate; and
   a plurality of vias, said vias comprising electrically interconnected test vias which are arranged in said substrate in first and second rows such that the heat dissipated when a stress test current is applied to said first row of test vias does not contribute to the heating of said second row of test vias, the first and second rows of test vias thereby remaining thermally isolated from one another.

8. The coupon as in claim 7 wherein said first row is positioned in between third and fourth rows of vias, which are not electrically interconnected with said test vias, said fourth row positioned between said first and second rows.

9. The coupon as in claim 7 wherein first and second test vias are electrically interconnected by means of a trace conductor which is mounted within said substrate.

10. The coupon as in claim 7 wherein first and second test vias are electrically interconnected by means of a trace conductor which is mounted on an external surface of said substrate.

11. The coupon as in claim 7 wherein the temperature of a test via during the application of the stress test current does not vary more than ±5° C. from the temperature of the other test vias.

12. The coupon as in claim 7 wherein said first and second rows are parallel.

13. A printed wiring board panel comprising:
   a printed wiring board formed on a substrate and including a plurality of conductive board vias; and
   a test coupon formed on the same substrate as said board, said coupon including a plurality of electrically interconnected test vias which are arranged in said substrate such that when a stress test current is applied to said test vias, the heat dissipated by each said test via does not contribute to the heating of the other test vias, the test vias thereby remaining thermally isolated from one another.

14. The panel as in claim 13 wherein the number of test vias on said coupon is related to the number of said board vias such that the stress testing of said test vias provides statistically meaningful information regarding the integrity of said board.

15. The panel as in claim 14 wherein said test vias for each respective coupon are arranged on the substrate in first and second rows.

16. The panel as in claim 15 wherein said first and second rows are thermally isolated from one another when a stress test current is applied to said test vias.

17. The panel as in claim 15 wherein said first and second rows are parallel.

18. A printed wiring board coupon comprising:
a substrate; and
a plurality of vias, said vias comprising electrically interconnected test vias which are arranged in said substrate in first and second rows such that the heat dissipated when a stress test current is applied to said first row of test vias does not contribute to the heating of said second row of test vias, the first and second rows of test vias thereby remaining thermally isolated from one another such that the temperature of any test via during the application of the stress test current does not vary more that $\pm 5°$ C. from the temperature of the other test vias.

* * * * *